US012604744B2

(12) United States Patent
Ecton et al.

(10) Patent No.: US 12,604,744 B2
(45) Date of Patent: Apr. 14, 2026

(54) INTEGRATION OF GLASS CORE INTO ELECTRONIC SUBSTRATES FOR FINE PITCH DIE TILING

(71) Applicant: Intel Corporation, Santa Clara, CA (US)

(72) Inventors: Jeremy D. Ecton, Gilbert, AZ (US); Brandon C. Marin, Gilbert, AZ (US); Aleksandar Aleksov, Chandler, AZ (US); Srinivas V. Pietambaram, Chandler, AZ (US); Leonel Arana, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 733 days.

(21) Appl. No.: 17/473,111

(22) Filed: Sep. 13, 2021

(65) Prior Publication Data

US 2023/0077486 A1     Mar. 16, 2023

(51) Int. Cl.
H01L 23/495     (2006.01)
H01L 23/15     (2006.01)
H01L 23/48     (2006.01)

(52) U.S. Cl.
CPC ........ H01L 23/49558 (2013.01); H01L 23/15 (2013.01); H01L 23/481 (2013.01)

(58) Field of Classification Search
CPC ... H01L 23/481; H01L 23/15; H01L 23/4955; H01L 23/49827; H01L 23/49822; H01L 21/486
See application file for complete search history.

(56) References Cited

U.S. PATENT DOCUMENTS

| | | | |
|---|---|---|---|
| 3,726,002 | A | 4/1973 | Greenstein |
| 9,449,935 | B1 | 9/2016 | Shih |
| 9,922,845 | B1 | 3/2018 | Shih |
| 10,290,571 | B2 | 5/2019 | Yu |
| 11,078,112 | B2 | 8/2021 | Dahlberg |
| 2010/0051896 | A1 | 3/2010 | Park |
| 2011/0147055 | A1 | 6/2011 | Ma |

(Continued)

FOREIGN PATENT DOCUMENTS

WO     WO 2018/026771 A1     2/2018

OTHER PUBLICATIONS

Office Action for U.S. Appl. No. 17/473,414 mailed Sep. 26, 2024, 7 pgs.

(Continued)

*Primary Examiner* — Davienne N Monbleau
*Assistant Examiner* — Emily Farmer
(74) *Attorney, Agent, or Firm* — Schwabe, Williamson & Wyatt P.C.

(57)     ABSTRACT

Embodiments disclosed herein include a package substrate. In an embodiment, the package substrate comprises a core with a first surface and a second surface, where the core comprises glass. In an embodiment, a first via is through the core, where the first via comprise a conductive material, and a film over the first surface of the core, where the film is an adhesive. In an embodiment, a second via is through the film, where the second via comprises a conductive material, where the second via contacts the first via. In an embodiment, a centerline of the second via is aligned with a centerline of the first via. In an embodiment, a buildup layer is over the film.

23 Claims, 33 Drawing Sheets

(56) References Cited

U.S. PATENT DOCUMENTS

| | | | |
|---|---|---|---|
| 2011/0304999 A1 | 12/2011 | Yu | |
| 2013/0069251 A1 | 3/2013 | Kunimoto | |
| 2013/0119555 A1 | 5/2013 | Sundaram | |
| 2014/0002009 A1 | 1/2014 | Choi | |
| 2014/0003009 A1* | 1/2014 | Ma | H01L 21/486 |
| | | | 174/262 |
| 2014/0073087 A1 | 3/2014 | Huang | |
| 2014/0085846 A1 | 3/2014 | Ma | |
| 2015/0008586 A1* | 1/2015 | Tsai | H01L 23/49816 |
| | | | 257/774 |
| 2015/0091182 A1 | 4/2015 | Chiu | |
| 2015/0279815 A1 | 10/2015 | Do | |
| 2016/0315024 A1 | 10/2016 | Lai | |
| 2016/0319626 A1 | 11/2016 | Dille | |
| 2016/0338202 A1* | 11/2016 | Park | H01L 24/00 |
| 2018/0342451 A1 | 11/2018 | Dahlberg | |
| 2019/0057917 A1 | 2/2019 | Tsai | |
| 2019/0088581 A1 | 3/2019 | Yu | |
| 2019/0131231 A1 | 5/2019 | Lu | |
| 2019/0181112 A1* | 6/2019 | Hu | H10F 39/8063 |
| 2019/0237430 A1 | 8/2019 | England | |
| 2019/0319626 A1* | 10/2019 | Dabral | H01L 25/0652 |
| 2019/0326273 A1 | 10/2019 | Bhagavat | |
| 2019/0341320 A1 | 11/2019 | Pollard | |
| 2019/0378820 A1 | 12/2019 | Gao | |
| 2019/0385966 A1 | 12/2019 | Gao | |
| 2020/0058592 A1* | 2/2020 | Kim | H01L 21/4857 |
| 2020/0111726 A1 | 4/2020 | Bellman | |
| 2020/0118959 A1 | 4/2020 | Kim | |
| 2021/0050251 A1 | 2/2021 | Hsiao | |
| 2021/0202332 A1* | 7/2021 | Hu | H01L 21/6835 |
| 2021/0210359 A1 | 7/2021 | Brown | |
| 2021/0280521 A1 | 9/2021 | Chen | |
| 2021/0305223 A1 | 9/2021 | Shih | |
| 2022/0051972 A1 | 2/2022 | Kim | |
| 2022/0394858 A1 | 12/2022 | Kamgaing | |
| 2022/0406696 A1 | 12/2022 | Aleksov | |
| 2023/0078099 A1 | 3/2023 | Ecton | |
| 2023/0079607 A1 | 3/2023 | Ecton | |

OTHER PUBLICATIONS

Extended European Search Report from European Patent Application No. 22184014.3, mailed Jan. 24, 2023, 10 pgs.

Office Action for U.S. Appl. No. 17/473,099 mailed Nov. 22, 2024, 18 pgs.

Office Action for U.S. Appl. No. 17/473,414 mailed Jan. 6, 2025, 11 pgs.

Final Office Action for U.S. Appl. No. 17/473,414 mailed Apr. 25, 2025, 14 pgs.

Final Office Action for U.S. Appl. No. 17/473,099 mailed Apr. 16, 2025, 24 pgs.

Office Action for U.S. Appl. No. 17/473,099 mailed Aug. 29, 2025, 24 pgs.

Office Action for U.S. Appl. No. 17/473,414 mailed Dec. 4, 2025, 17 pgs.

* cited by examiner

221

224

207

204

251

201

361

351

301

315

361

351

301

INTEGRATION OF GLASS CORE INTO ELECTRONIC SUBSTRATES FOR FINE PITCH DIE TILING

TECHNICAL FIELD

Embodiments of the present disclosure relate to electronic packages, and more particularly to electronic packages with glass cores.

BACKGROUND

The demand for miniaturization of form factor and increased levels of integration for high performance are driving sophisticated packaging approaches in the semiconductor industry. Die partitioning enables miniaturization of small form factor and high performance without yield issues seen with other methods. However, such die partitioning needs fine die to die interconnections. Bridge die architectures are a technology that enables a lower cost and simpler 2.5D packaging approach for very high-density interconnects between heterogeneous dies on a single package. Instead of an expensive silicon interposer with through silicon vias (TSVs), a small silicon bridge chip is embedded in the package, enabling very high density die-to-die connections only where needed. Standard flip-chip assembly is used for robust power delivery and to connect high-speed signals directly from chip to the package substrate.

For future generations of die partitioning, several bridges that can connect the dies at much finer bump pitches (25 microns or lower) than that are currently delivered by bridge dies are needed. Typical bridge die architectures suffer from a high cumulative bump thickness variation (BTV) and as the number of bridges to be embedded increase, cost of embedding and yields will suffer. Alternate architectures and/or approaches have been proposed and are being actively investigated. One option for enabling fine die-to-die interconnections is incorporating a thin glass core into the substrate package. Compared to conventional epoxy cores, glass cores offer several advantages including a higher plated through hole (PTH) density, lower signal losses, lower total thickness variation (TTV), among others. However, handling a thin glass core (e.g., on the order of 400 μm to 500 μm) at a panel level (e.g., 510 mm×515 mm) is a significant challenge. Thus, alternative options that do not require repurposing existing substrate manufacturing infrastructure for thin core glass handling would lead to significant reductions in capital expenditure.

EMBODIMENTS OF THE PRESENT DISCLOSURE

Figure 1A:
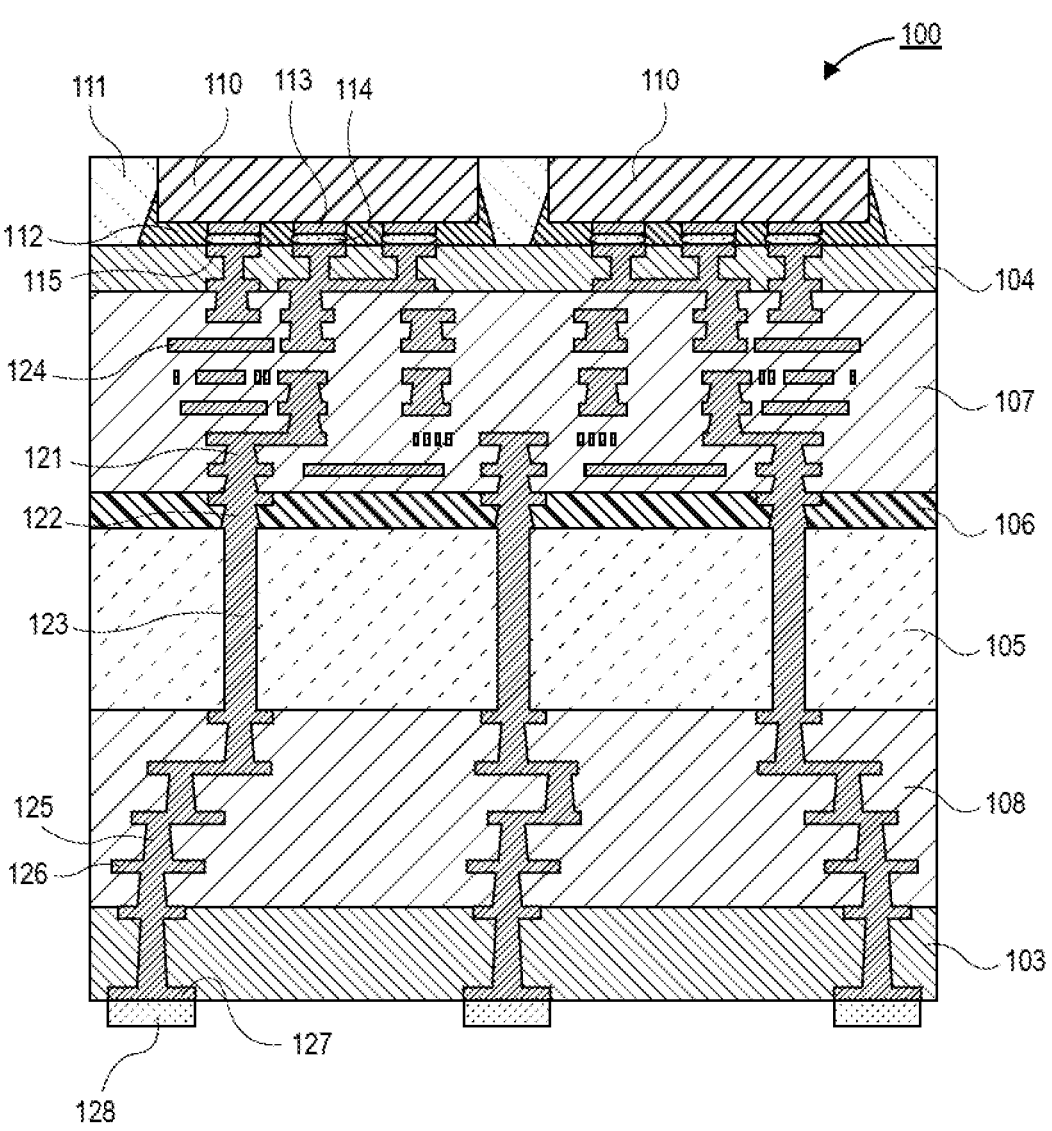
FIG. 1A is a cross-sectional illustration of an electronic package with a glass core and solder first level interconnects (FLIs), in accordance with an embodiment.

Described herein are electronic packages with glass cores, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, full panel glass processes for thin glass substrates would require a retooling in order to be able to handle such substrates. Accordingly, embodiments disclosed herein include a glass core stitching process. In such an embodiment, the substrate is initially fabricated on a carrier, such as a thick glass carrier. Later in the process flow, the thin glass core is attached to the substrate using a bond film followed by a self-aligned dry etch process to connect the outer core routing to the underlying core routing. In addition to relaxing capital expenditure requirements for handling a thin glass core, this approach also enables new architectures with improved capability. For example, a monolithic FLI first architecture and a solderless monolithic bridge die face down architecture are possible.

With respect to the glass core, the form factor can be reduced compared to existing panel level form factors. For example, when a stitched glass core is used, the thickness of the glass core can be reduced (e.g., to a thickness of 50 μm or lower). Additionally, a unit-sized form factor would enable simpler dicing processes since there would be no need to cut through the glass core.

With respect to FLI first architectures, improved yield is provided compared to existing processes. Typically, a FLI first with hybrid bonding between the die and the substrate utilizing a coreless patch results in significant warpage after carrier release. By incorporating a glass core into the substrate, reduced warpage is observed post carrier release and a flatter surface is provided, which improves hybrid bonding yield.

With respect to bridge face down architectures, embodiments disclosed herein allow for lower total thickness variation (TTV) which results in lower rBTV necessary for bump pitch scaling. Additionally, bottom side solder below the vias through the bridge die is eliminated. This improves the electrical performance (e.g., lower resistance compared to a solder connection).

Referring now to FIG. 1A, a cross-sectional illustration of an electronic package 100 is shown, in accordance with an embodiment. In an embodiment, the electronic package 100 comprises a core 105. In an embodiment, the core 105 comprises glass. The core 105 may be a glass substrate with any suitable glass formulation. In an embodiment, the core 105 has a thickness that is approximately 500 μm or smaller. In a particular embodiment, the core 105 may be approximately 50 μm or smaller. As used herein "approximately" may refer to a value that is within 10% of the stated value. For example, approximately 100 μm would refer to a range between 90 μm and 110 μm. Conductive vias 123 may pass through a thickness of the core 105.

In an embodiment, a first buildup layers 108 may be provided below the core 105. The first buildup layers 108 may comprise conductive routing such as pads/traces 126 and vias 125. In an embodiment, the vias 125 may have a tapered profile with a wide end and a narrow end. The taper may be oriented so that a distance between the narrow end of the via 125 and the core 105 is smaller than a distance between the wide end of the via 125 and the core 105. In an embodiment, a solder resist layer 103 may be provided below the first buildup layers 108. Second level interconnects (SLI) pads 127 and solder 128 may be provided on the solder resist layer 103.

In an embodiment, second buildup layers 107 are provided over the core 105. The second buildup layers 107 may be attached to the core 105 by a film 106. In an embodiment, the film 106 is an adhesive, such as a bond film. In an embodiment, vias 122 are provided through the film 106. In an embodiment, the vias 122 are aligned with the vias 123 through the core 105. For example, a centerline of the via 122 may be substantially aligned with a centerline of the underlying via 123. The alignment between the vias 122 and the vias 123 may be provided by a self-aligned etching process, as will be described in greater detail below. Additionally, it is to be appreciated that the vias 122 may be directly connected to the vias 123. That is, there may not be a pad between the vias 122 and the vias 123.

In an embodiment, the via 122 has a tapered profile with a wide end and a narrow end. A distance between the wide end of the via 122 and the core 105 may be smaller than a distance between the narrow end of the via 122 and the core 105. For example, the wide end of the via 122 may be at the interface between the film 106 and the core 105. In some embodiments, the wide end of the via 122 may have a width that is greater than a width of the via 123 through the core 105.

In an embodiment, the vias 122 may be electrically coupled to first level interconnect (FLI) pads 115 by conductive routing (e.g., pads/traces 124 and vias 121) through the second buildup layers 107 and a solder resist layer 104. In an embodiment, the orientation of the vias 121 is characteristic of a FLI first assembly process. That is, a distance between a wide end of the via 121 and the FLI pad 115 is greater than a distance between a narrow end of the via 121 and the FLI pad 115.

In an embodiment, one or more dies 110 are coupled to the FLI pads 115. The FLI may include a solder 114 that is coupled to a pad 113 on the die 110. An underfill 112 may surround the FLIs. Additionally, a mold layer 111 may encapsulate the dies 110. A backside surface of the dies 110 may be exposed in some embodiments.

Figure 1B:
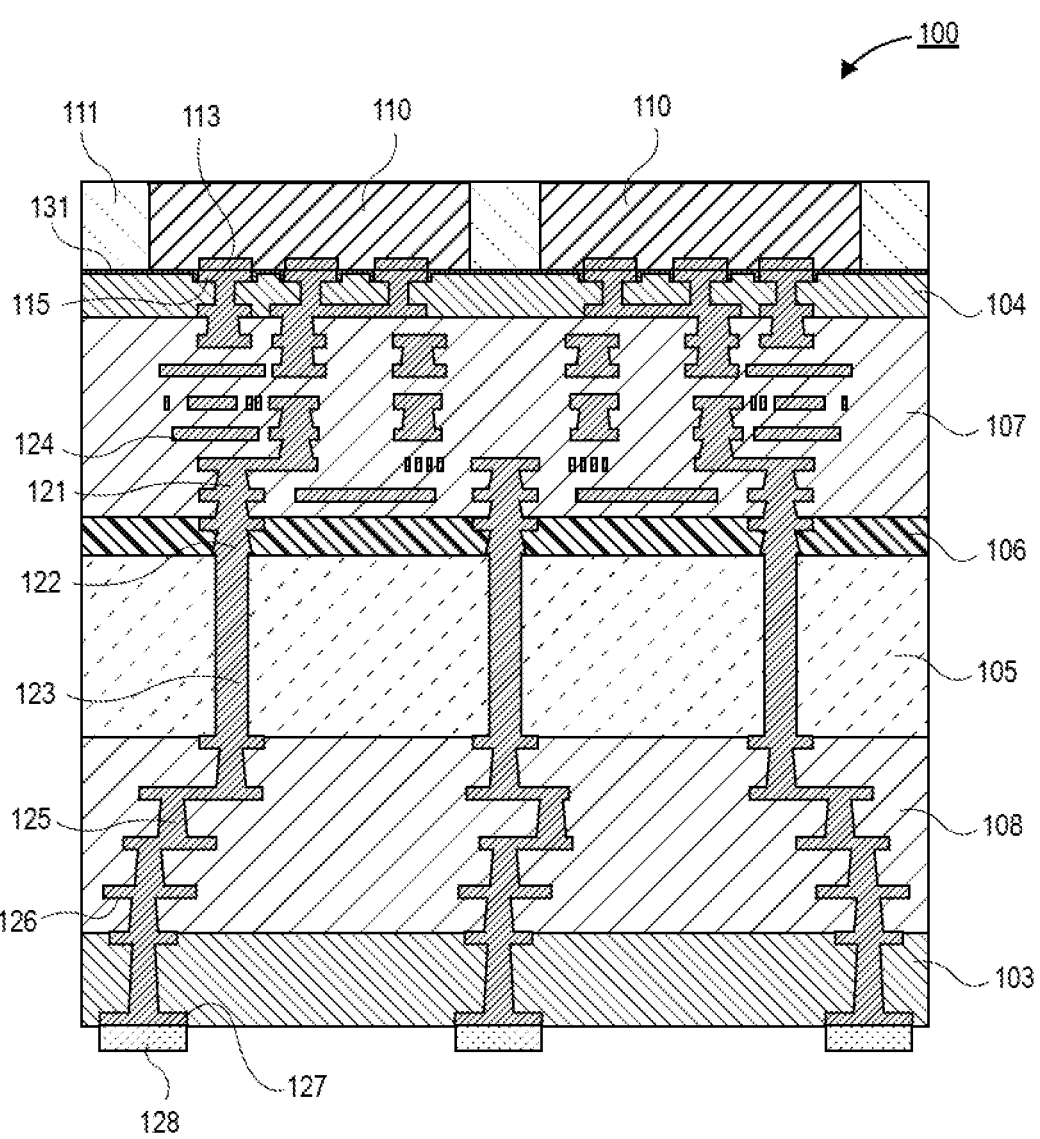
FIG. 1B is a cross-sectional illustration of an electronic package with a glass core and hybrid bonding FLIs, in accordance with an embodiment.

Referring now to FIG. 1B, a cross-sectional illustration of an electronic package 100 is shown, in accordance with an additional embodiment. In an embodiment, the electronic package 100 in FIG. 1B may be similar to the electronic package 100 in FIG. 1A, with the exception of the FLI region. Instead of using a solder FLI, the embodiment shown in FIG. 1B includes a hybrid bonding FLI. As shown, a hybrid bonding layer 131 is provided over the solder resist 104 and along sidewalls of the FLI pads 115. The hybrid bonding layer 131 may be a dielectric. In a particular embodiment, the hybrid bonding layer 131 comprises silicon and oxygen (e.g., $SiO_2$).

In order to form a hybrid bond, a dielectric (not shown) on the die 110 interfaces with the hybrid bonding layer 131, and the pad 113 on the die 110 bonds with the FLI pad 115 with interdiffusion bonding. In some embodiments, the interdiffusion bonding may result in there not being a distinctive interface between the pads 113 and the FLI pads 115, as is shown in FIG. 1B.

Figure 1C:
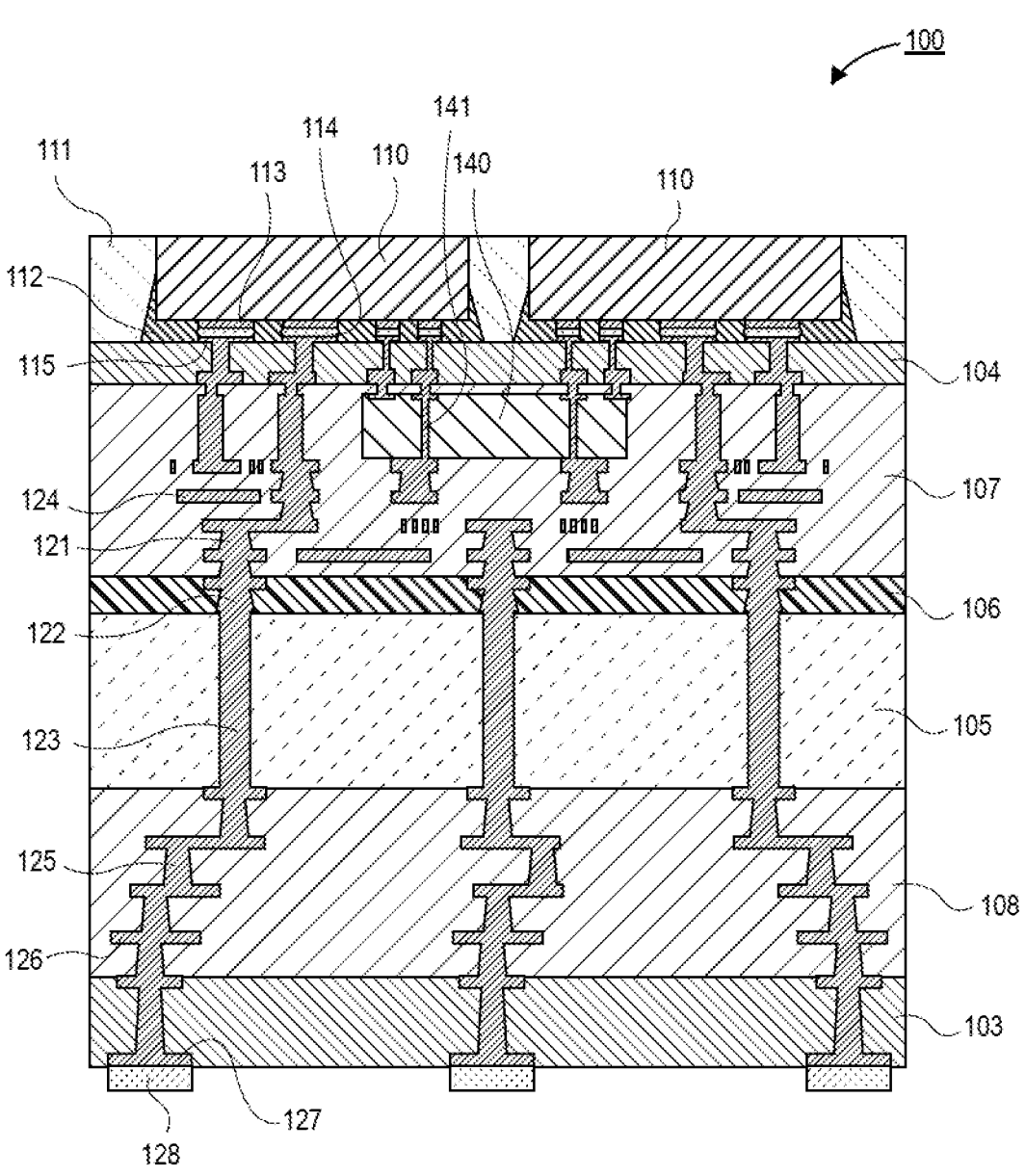
FIG. 1C is a cross-sectional illustration of an electronic package with a glass core and a bridge, in accordance with an embodiment.

Referring now to FIG. 1C, a cross-sectional illustration of an electronic package 100 is shown, in accordance with yet another embodiment. In an embodiment, the electronic package 100 in FIG. 1C is similar to the electronic package 100 in FIG. 1A, with the exception of there being an embedded bridge 140 included in the second buildup layers 107. As shown, the bridge 140 may comprise vias 141 through a thickness of the bridge 140. In an embodiment, the backside of the bridge 140 may be contacted directly by pads 124 and vias 121. That is, there is no need for a solder connection on the backside of the bridge 140. This provides improved electrical performance.

Referring now to FIGS. 2A-2I, a series of cross-sectional illustrations depicting a process for forming an electronic package is shown, in accordance with an embodiment. The electronic package fabricated in FIGS. 2A-2I may be substantially similar to the electronic package 100 shown in FIG. 1A.

Figure 2A:
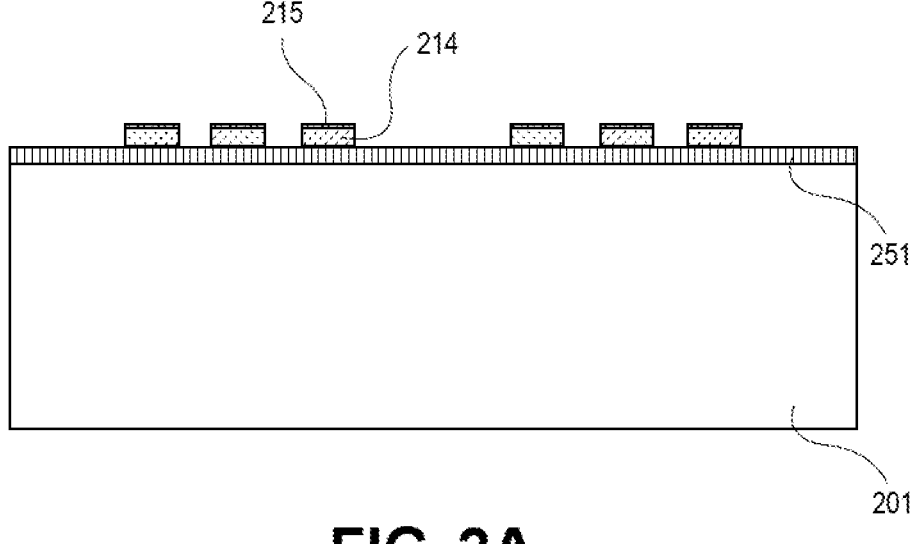
FIGS. 2A-2I are cross-sectional illustrations depicting a process for fabricating an electronic package similar to the electronic package shown in FIG. 1A, in accordance with an embodiment.

Referring now to FIG. 2A, a cross-sectional illustration of a carrier 201 is shown, in accordance with an embodiment. In an embodiment, the carrier 201 may be a thick glass carrier. A release layer 251 may be provided over a top surface of the carrier 201. The release layer 251 may be a laser activated release layer. That is, when exposed to a laser, the release layer 251 detaches to release the carrier 201. In an embodiment, FLI bumps are provided over the release layer 251. For example, the FLI bumps may include a solder 214 and FLI pads 215. Such a process may be referred to as FLI first since the FLI region is fabricated before other package structures.

Figure 2B:
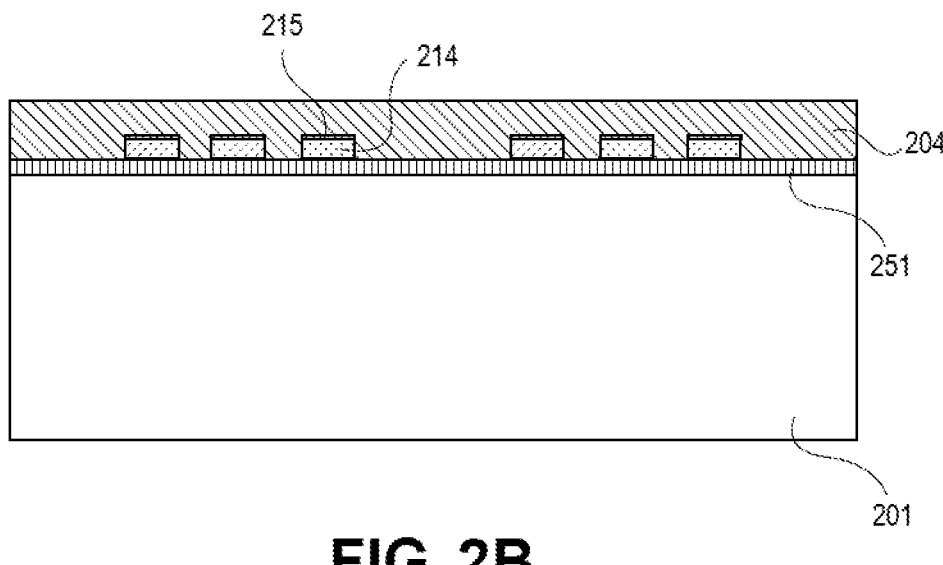

Referring now to FIG. 2B, a cross-sectional illustration of the structure after a solder resist layer 204 is disposed of the FLI pads 215 is shown, in accordance with an embodiment. The solder resist layer 204 may be disposed with a lamination process or the like.

Figure 2C:
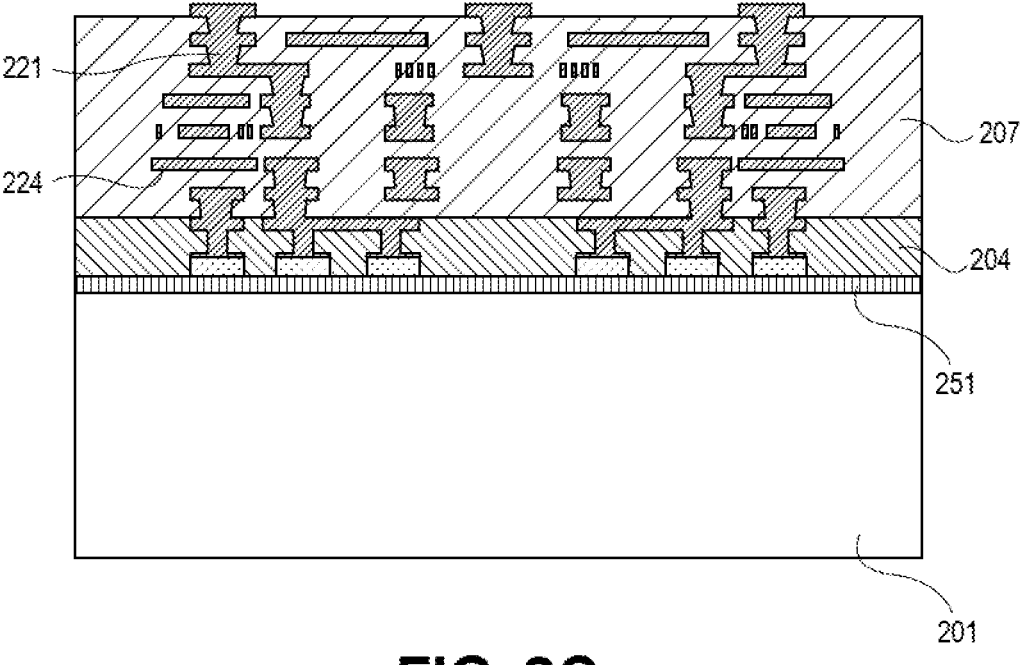

Referring now to FIG. 2C, a cross-sectional illustration of the structure after buildup layers 207 are fabricated over the solder resist layer 204 is shown, in accordance with an embodiment. In an embodiment, conductive routing may be provided in the buildup layers 207. For example, conductive pads/traces 224 and vias 221 may be provided in the buildup layers 207. Particularly, it is to be appreciated that the vias 221 are oriented so that the narrow ends are closer to the FLI pads than the wide ends. This is different than the orientation of typical package substrates that have an FLI last assembly. In FLI last architectures, the narrow ends of the vias are further from the FLI pads than the wide ends of the vias.

Figure 2D:
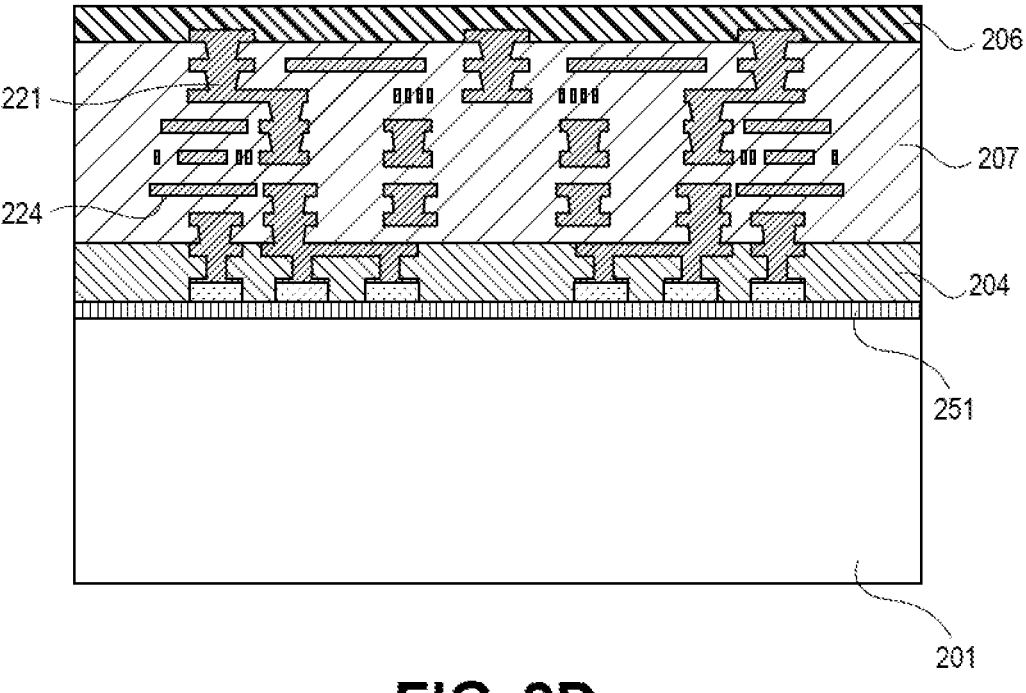

Referring now to FIG. 2D, a cross-sectional illustration of the structure after a film 206 is disposed over the buildup layers 207 is shown, in accordance with an embodiment. In an embodiment, the film 206 is a bond film. For example, the film 206 may be an adhesive dielectric or the like. The film 206 may conform to the pads 224 on a top surface of the buildup layers 207.

Figure 2E:
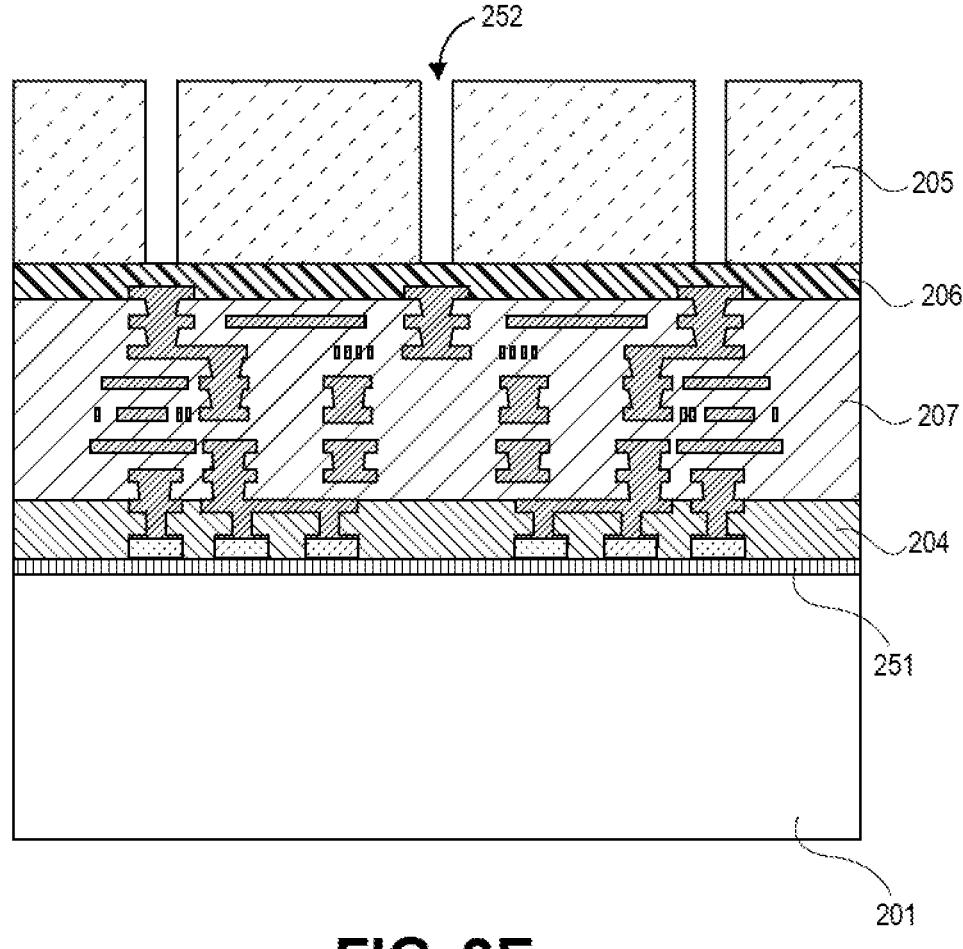

Referring now to FIG. 2E, a cross-sectional illustration of the structure after a core 205 is attached to the film 206 is shown, in accordance with an embodiment. In an embodiment, the core 205 may have via openings 252 patterned through a thickness of the core 205 before the core 205 is attached to the film 206. In an embodiment, the core 205 may comprise glass. For example, the core 205 may be a glass substrate with any suitable glass formulation. In an embodiment, the form factor of the core 205 may be smaller than panel sized. In a particular embodiment, the core 205 may have a unit sized form factor. That is, the core 205 may be sized to be used for a single electronic package. In an embodiment, a thickness of the core 205 may be approximately 500 μm or smaller. In a particular embodiment the core 205 may have a thickness of approximately 50 μm or smaller. The smaller form factor of the core 205 allows for easier handling despite the thinness of the core 205.

Figure 2F:
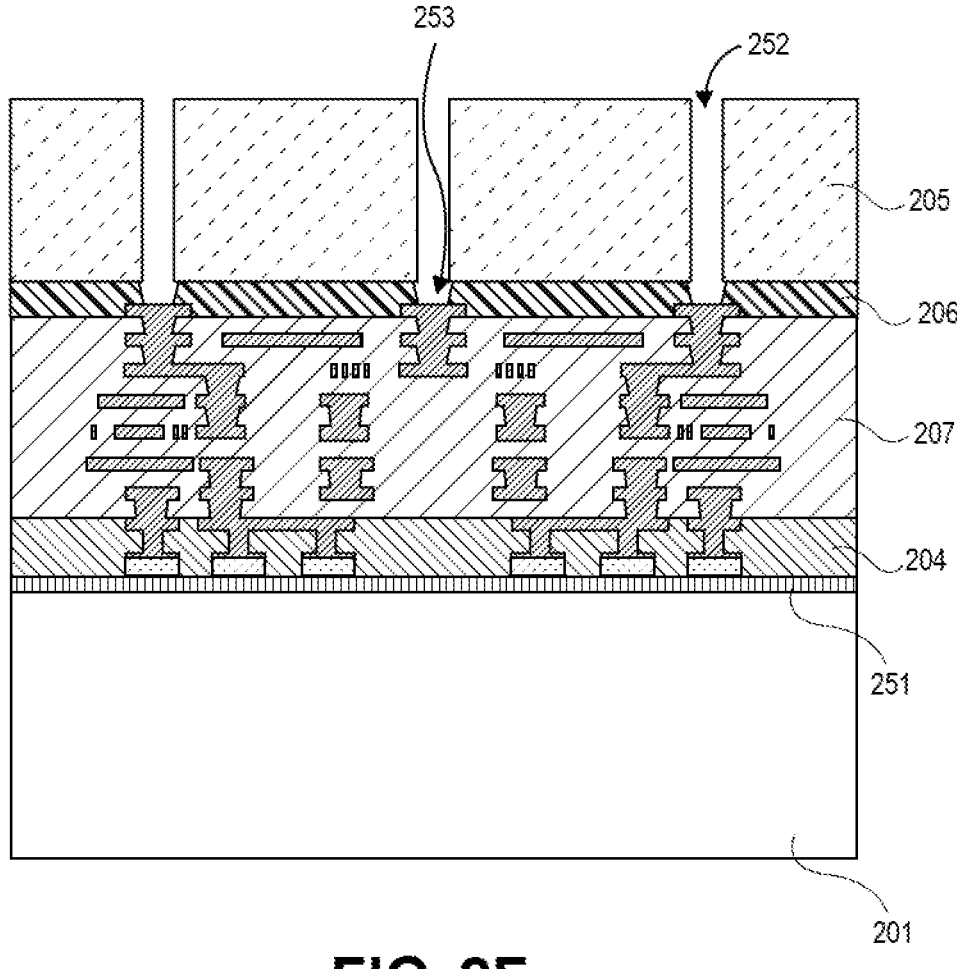

Referring now to FIG. 2F, a cross-sectional illustration of the structure after openings 253 are formed through the film 206 is shown, in accordance with an embodiment. In an embodiment, the openings are formed with a dry etching process (e.g., a plasma etching process). Since the core 205 serves as the mask for the etching process, the openings 253 are self-aligned with the via openings 252. For example, centerlines of the via openings 252 may be substantially aligned with centerlines of the openings 252. In some embodiments, there may be some degree of undercutting with the etching process. As such, a top of the openings 253 may be wider than the openings 252 in some embodiments. Additionally, the openings 253 may have a tapered cross-section with the core 205 closer to a wider end than the narrow end.

Figure 2G:
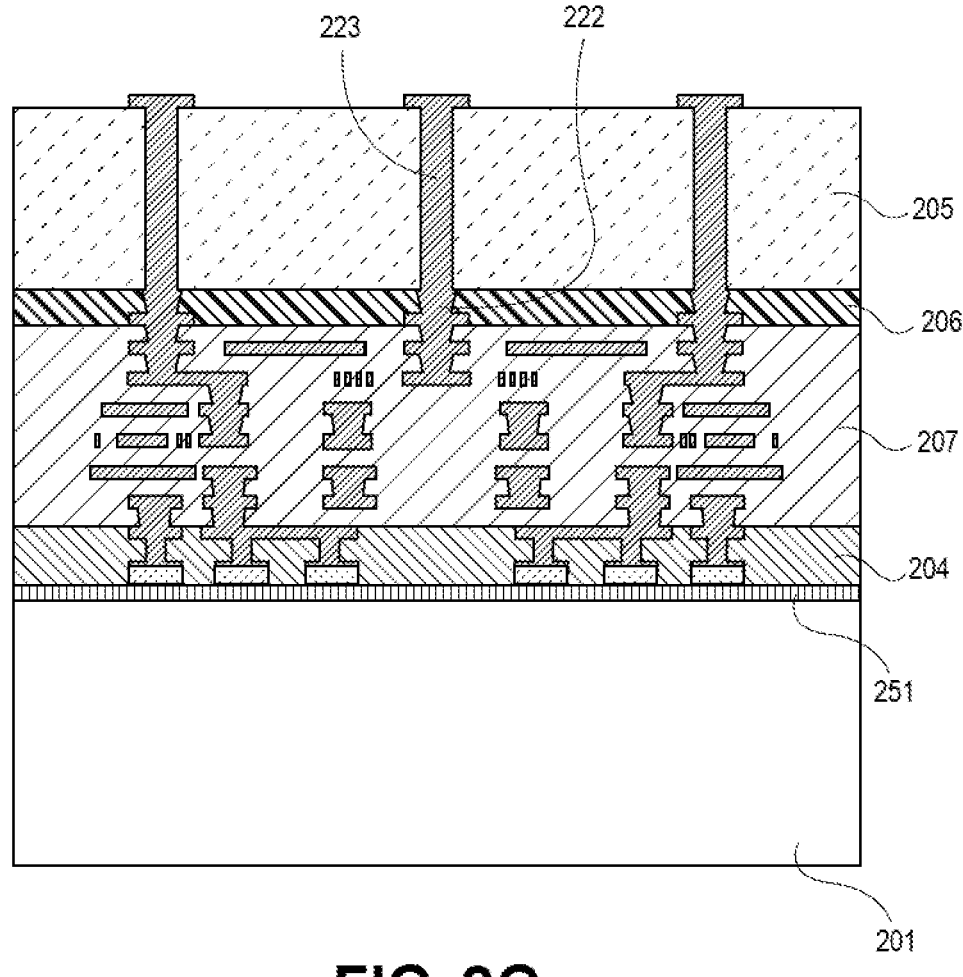

Referring now to FIG. 2G, a cross-sectional illustration of the structure after conductive material is disposed in the openings 252 and 253 to form vias is shown, in accordance with an embodiment. In an embodiment, a first via 223 is formed through the core 205 and a second via 222 is formed through the film 206. The conductive material may be deposited with any suitable deposition process (e.g., seed deposition, resist pattern, copper plate, and seed etch). It is to be appreciated that the first via 223 and the second via 222 are directly in contact with each other. That is, there is no pad or other feature provided between the first via 223 and the second via 222. Additionally, the interface between the first via 223 and the second via 222 may be identified by a sharp change in the width of the conductive material. For example, at the interface, the second via 222 may be wider than the first via 223.

Figure 2H:
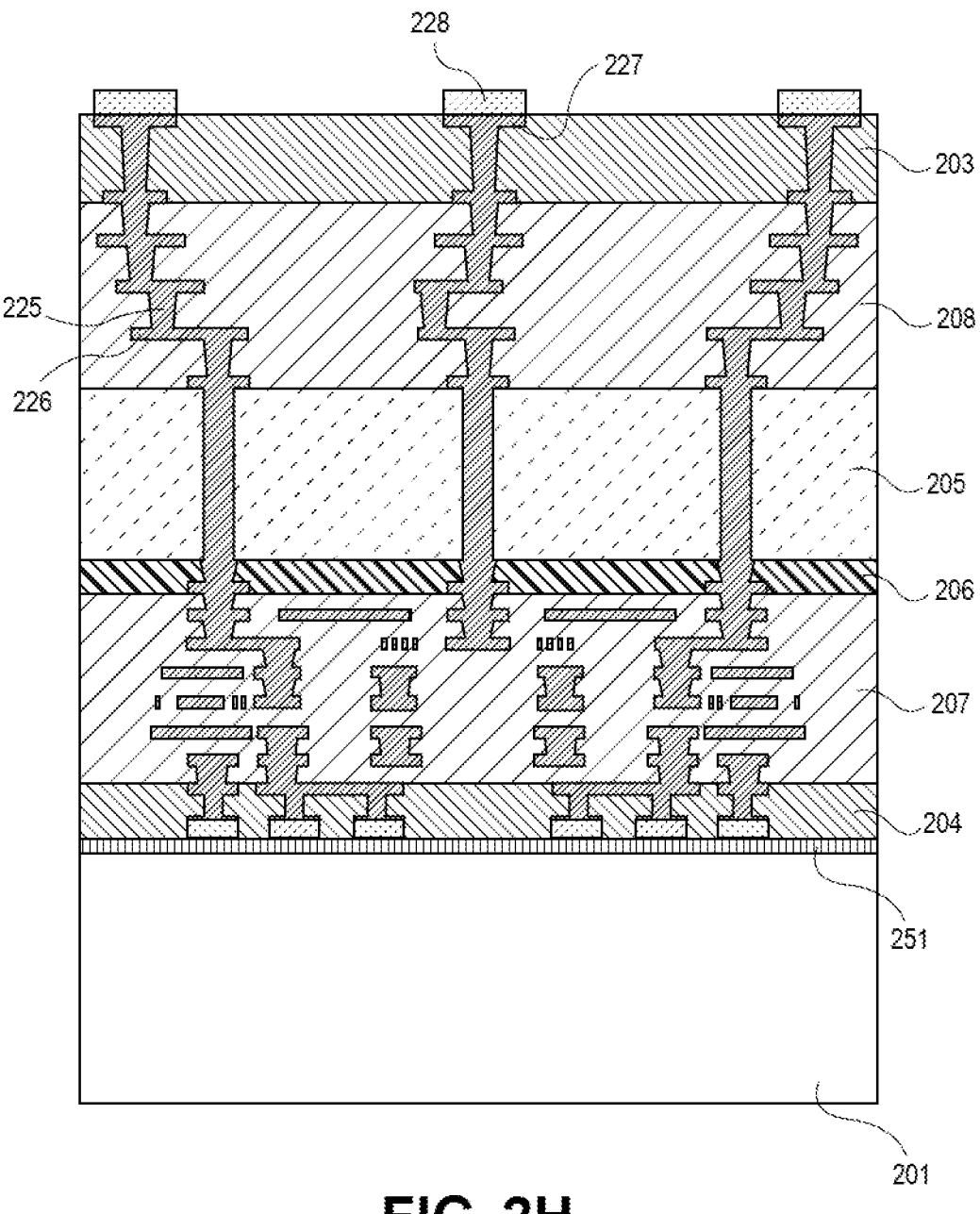

Referring now to FIG. 2H, a cross-sectional illustration of the structure after second buildup layers 208 and a second solder resist 203 are formed is shown, in accordance with an embodiment. In an embodiment, the second buildup layers 208 may comprise conductive routing (e.g., pads/traces 226 and vias 225). Second level interconnect (SLI) pads 227 may be provided in the second solder resist 203. A microball 228 may be provided over the SLI pads 227. However, it is to be appreciated that the interconnect feature may be other materials than a microball 228. For example, solder may also be used in some embodiments. Additionally, while referred to as an SLI interface, it is to be appreciated that the SLI pads 227 may also be mid-level interconnect (MLI) pads.

Figure 2I:
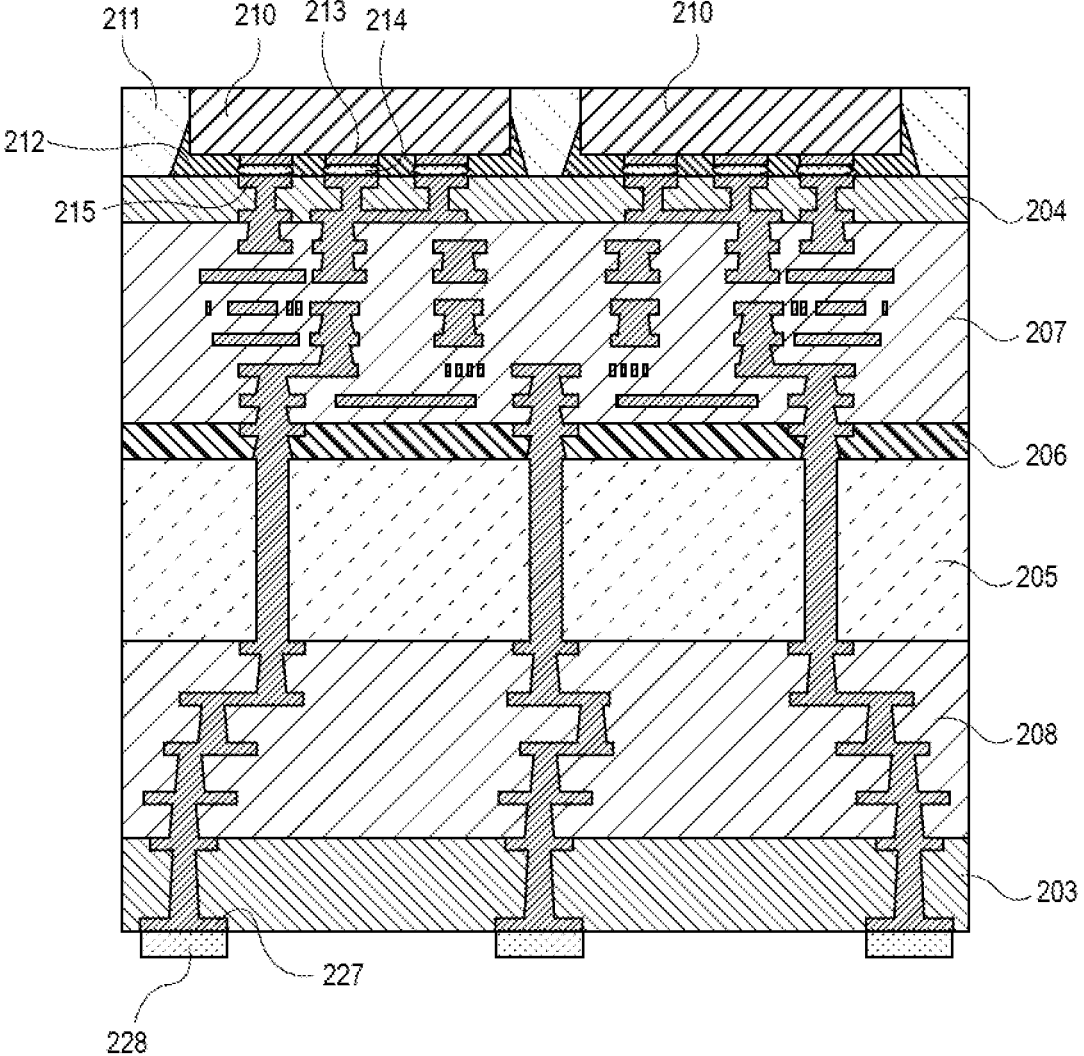

Referring now to FIG. 2I, a cross-sectional illustration of the structure after the carrier 201 is removed and dies 210 are attached is shown, in accordance with an embodiment. In an embodiment, the release layer 251 may be activated to release the FLI region from the carrier 201. In an embodiment, the solder resist layer 204 may be etched back to reveal the solder 214. Pads 213 of the dies 210 may then be attached to the solder 214 to form the FLI between the dies 210 and the package substrate. An underfill 212 may surround the FLIs and a mold layer 211 may be formed around the dies 210. The backside of the mold layer 211 may be recessed (e.g., with a grinding process) to expose the backside surface of the dies 210.

Referring now to FIGS. 3A-3K, a series of cross-sectional illustrations depicting a process for forming an electronic package is shown, in accordance with an embodiment. The electronic package fabricated in FIGS. 3A-3K may be substantially similar to the electronic package 100 shown in FIG. 1B.

Figures 3A, 3B:
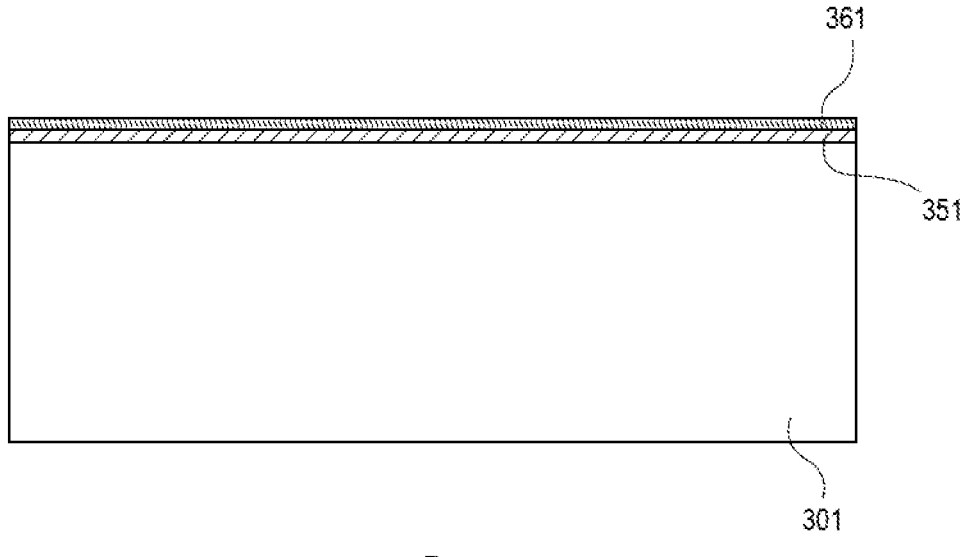
FIGS. 3A-3K are cross-sectional illustrations depicting a process for fabricating an electronic package similar to the electronic package shown in FIG. 1B, in accordance with an embodiment.

Referring now to FIG. 3A, a cross-sectional illustration of a carrier 301 is shown, in accordance with an embodiment. In an embodiment, the carrier 301 may be a glass carrier or the like. In an embodiment, a release layer 351 is disposed over a top surface of the carrier 301. The release layer 351 may be a laser activated release layer. In an embodiment, a seed layer 361 is disposed over a top surface of the release layer 351. The seed layer 361 may comprise titanium or nickel in some embodiments.

Referring now to FIG. 3B, a cross-sectional illustration of the structure after FLI pads 315 are formed over the seed layer 361 is shown, in accordance with an embodiment. Such a process may be referred to as FLI first since the FLI region is fabricated before other package structures.

Figures 3C, 3D:
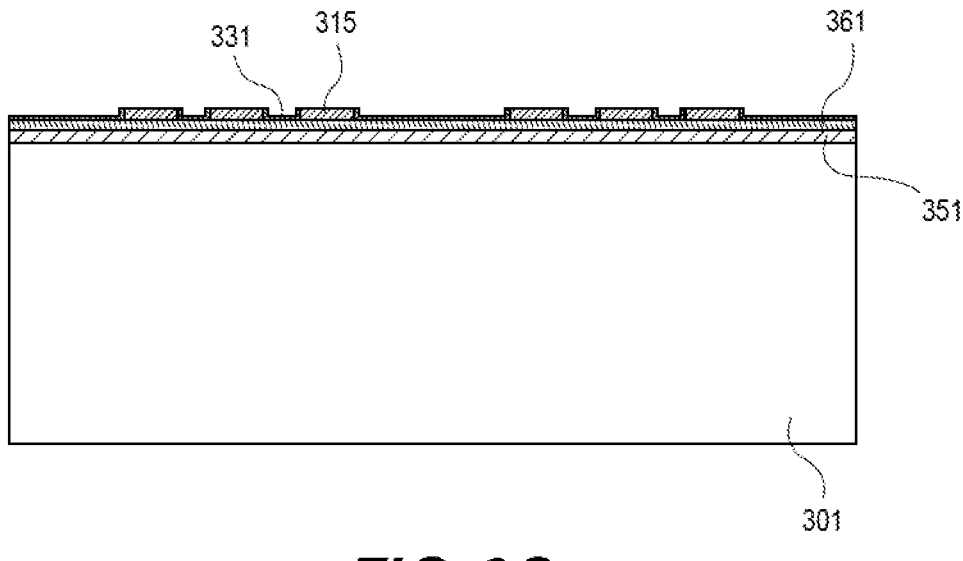

Referring now to FIG. 3C, a cross-sectional illustration of the structure after a hybrid bonding layer 331 is disposed over the exposed surfaces is shown, in accordance with an embodiment. In an embodiment, the hybrid bonding layer 331 may be a layer that provides low temperature bonding with a die in a subsequent bonding operation. The hybrid bonding layer 331 may be a dielectric material. For example, the hybrid bonding layer 331 may comprise silicon and oxygen (e.g., $SiO_x$). In an embodiment, the hybrid bonding layer 331 covers the seed layer 361 and is disposed over sidewalls and a top surface of the FLI pads 315.

Referring now to FIG. 3D, a cross-sectional illustration of the structure after a solder resist layer 304 is disposed over the FLI pads 315 is shown, in accordance with an embodiment. In an embodiment, the solder resist layer 304 is disposed with a lamination process. After deposition, a polishing or grinding process is used to expose the top surfaces of the FLI pads 315. The polishing may remove the portion of the hybrid bonding layer 331 over the top surface of the FLI pads 315 so that the conductive material is exposed.

Figure 3E:
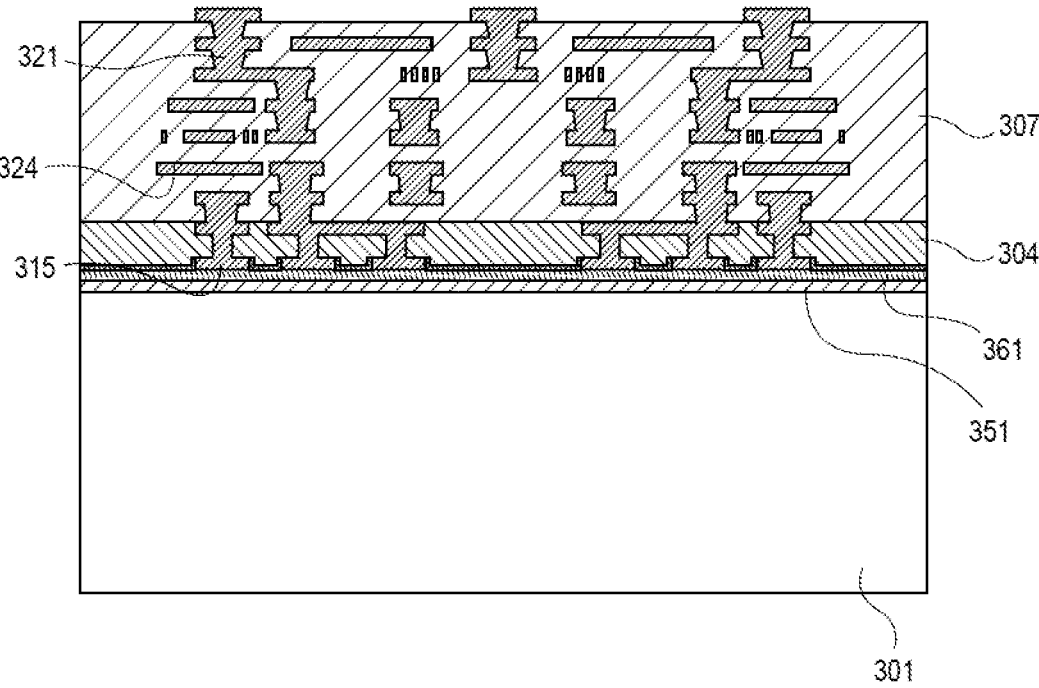

Referring now to FIG. 3E, a cross-sectional illustration of the structure after buildup layers 307 are formed is shown, in accordance with an embodiment. Additionally, the solder resist layer 304 may be extended with conductive features reaching FLI pads 315 through the solder resist layer 304. Conductive routing (e.g., pads/traces 324 and vias 321) may be provided in the buildup layers 307. Particularly, it is to be appreciated that the vias 321 are oriented so that the narrow ends are closer to the FLI pads 315 than the wide ends. This is different than the orientation of typical package substrates that have an FLI last assembly. In FLI last architectures, the narrow ends of the vias are further from the FLI pads than the wide ends of the vias.

Figure 3F:
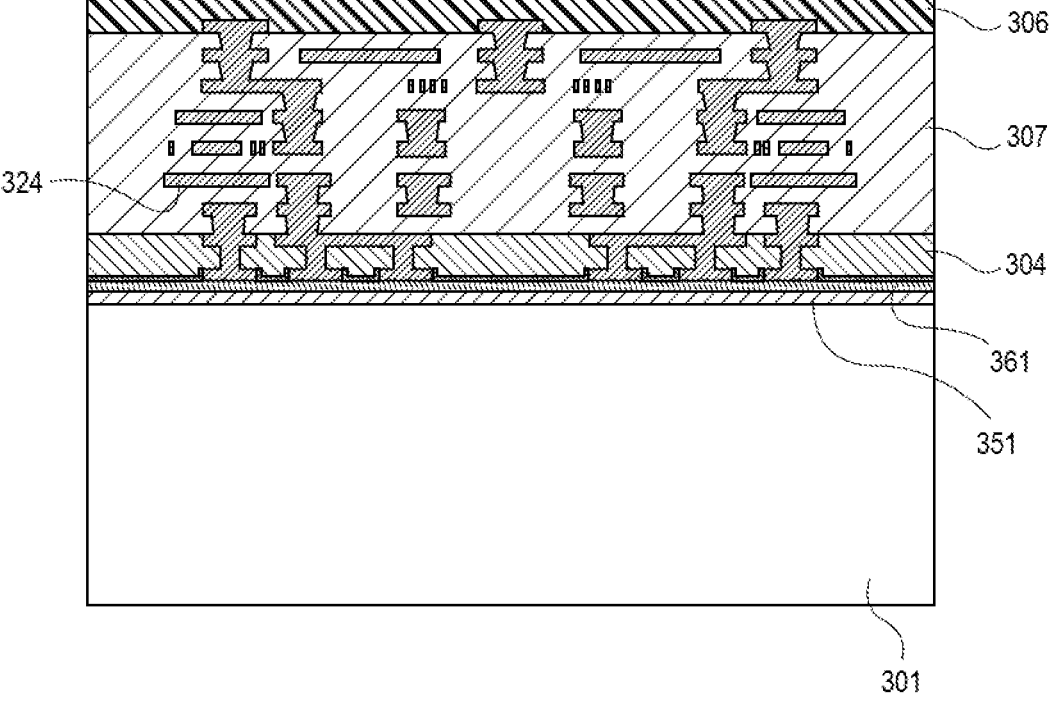

Referring now to FIG. 3F, a cross-sectional illustration of the structure after a film 306 is disposed over the buildup layers 307 is shown, in accordance with an embodiment. In an embodiment, the film 306 is a bond film. For example, the film 306 may be an adhesive dielectric or the like. The film 306 may conform to the pads 324 on a top surface of the buildup layers 307.

Figure 3G:
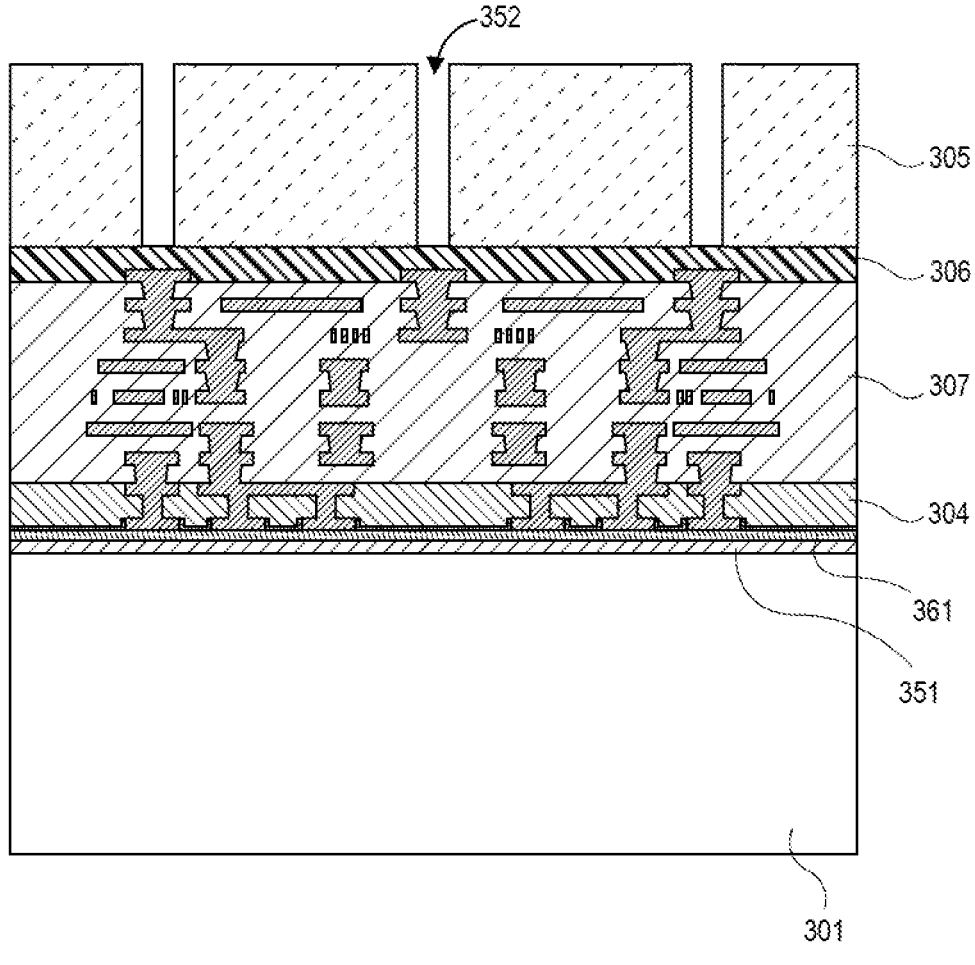

Referring now to FIG. 3G, a cross-sectional illustration of the structure after a core 305 is attached to the film 306 is shown, in accordance with an embodiment. In an embodiment, the core 305 may have via openings 352 patterned through a thickness of the core 305 before the core 305 is attached to the film 306. In an embodiment, the core 305 may comprise glass. For example, the core 305 may be a glass substrate with any suitable glass formulation. In an embodiment, the form factor of the core 305 may be smaller than panel sized. In a particular embodiment, the core 305 may have a unit sized form factor. That is, the core 305 may be sized to be used for a single electronic package. In an embodiment, a thickness of the core 305 may be approximately 500 μm or smaller. In a particular embodiment the core 305 may have a thickness of approximately 50 μm or smaller. The smaller form factor of the core 305 allows for easier handling despite the thinness of the core 305.

Figure 3H:
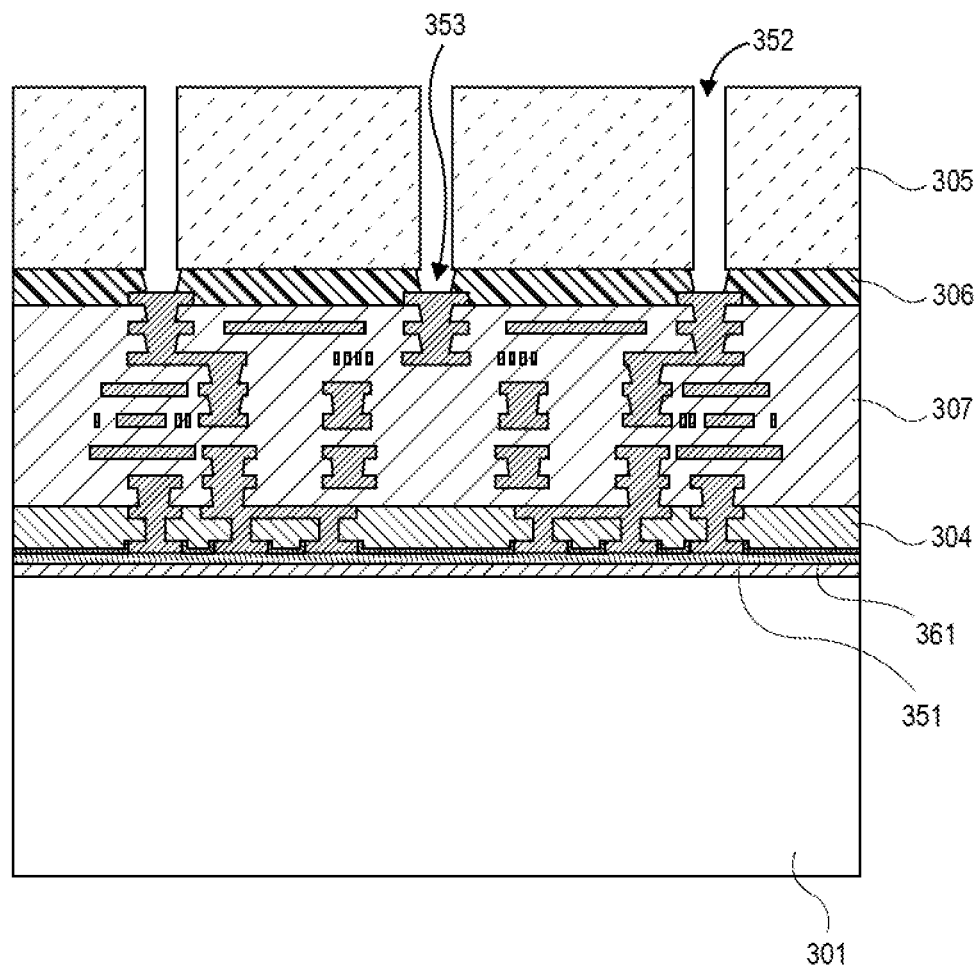

Referring now to FIG. 3H, a cross-sectional illustration of the structure after openings 353 are formed through the film 306 is shown, in accordance with an embodiment. In an embodiment, the openings are formed with a dry etching process (e.g., a plasma etching process). Since the core 305 serves as the mask for the etching process, the openings 353 are self-aligned with the via openings 352. For example, centerlines of the via openings 352 may be substantially aligned with centerlines of the openings 352. In some embodiments, there may be some degree of undercutting with the etching process. As such, a top of the openings 353 may be wider than the openings 352 in some embodiments. Additionally, the openings 353 may have a tapered cross-section with the core 305 closer to a wider end than the narrow end.

Figure 3I:
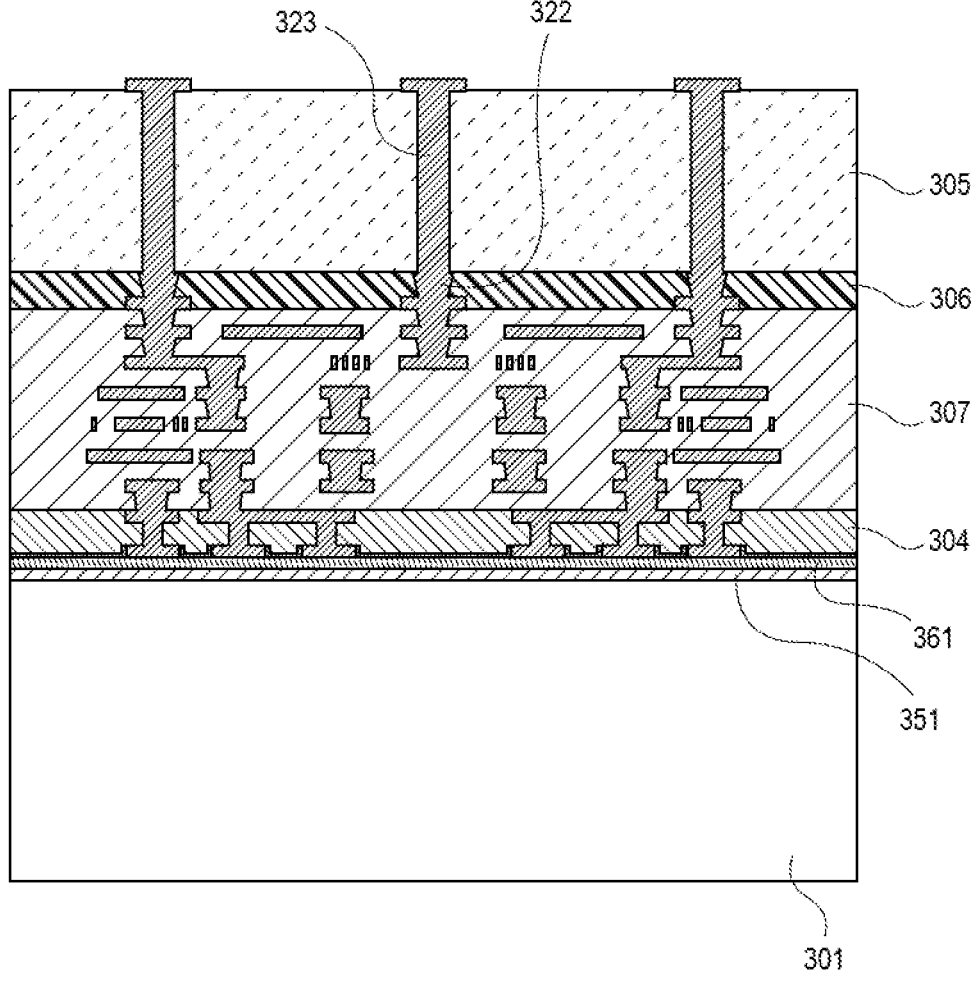

Referring now to FIG. 3I, a cross-sectional illustration of the structure after conductive material is disposed in the openings 352 and 353 to form vias is shown, in accordance with an embodiment. In an embodiment, a first via 323 is formed through the core 305 and a second via 322 is formed through the film 306. The conductive material may be deposited with any suitable deposition process (e.g., seed deposition, resist pattern, copper plate, and seed etch). It is to be appreciated that the first via 323 and the second via 322 are directly in contact with each other. That is, there is no pad or other feature provided between the first via 323 and the second via 322. Additionally, the interface between the first via 323 and the second via 322 may be identified by a sharp change in the width of the conductive material. For example, at the interface, the second via 322 may be wider than the first via 323.

Figure 3J:
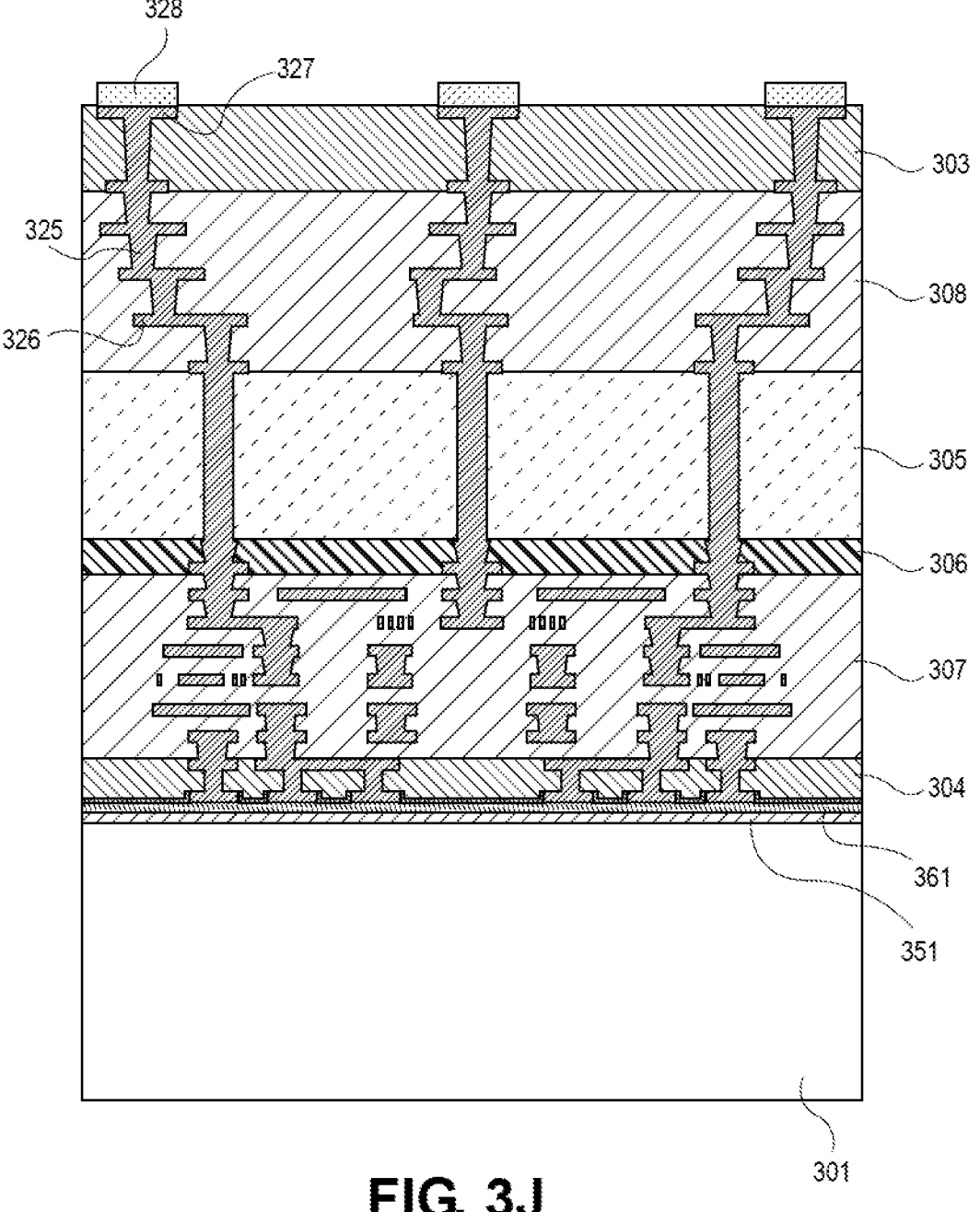

Referring now to FIG. 3J, a cross-sectional illustration of the structure after second buildup layers 308 and a second solder resist 303 are formed is shown, in accordance with an embodiment. In an embodiment, the second buildup layers 308 may comprise conductive routing (e.g., pads/traces 326 and vias 325). Second level interconnect (SLI) pads 327 may be provided in the second solder resist 303. A solder 328 may be provided over the SLI pads 327.

Figure 3K:
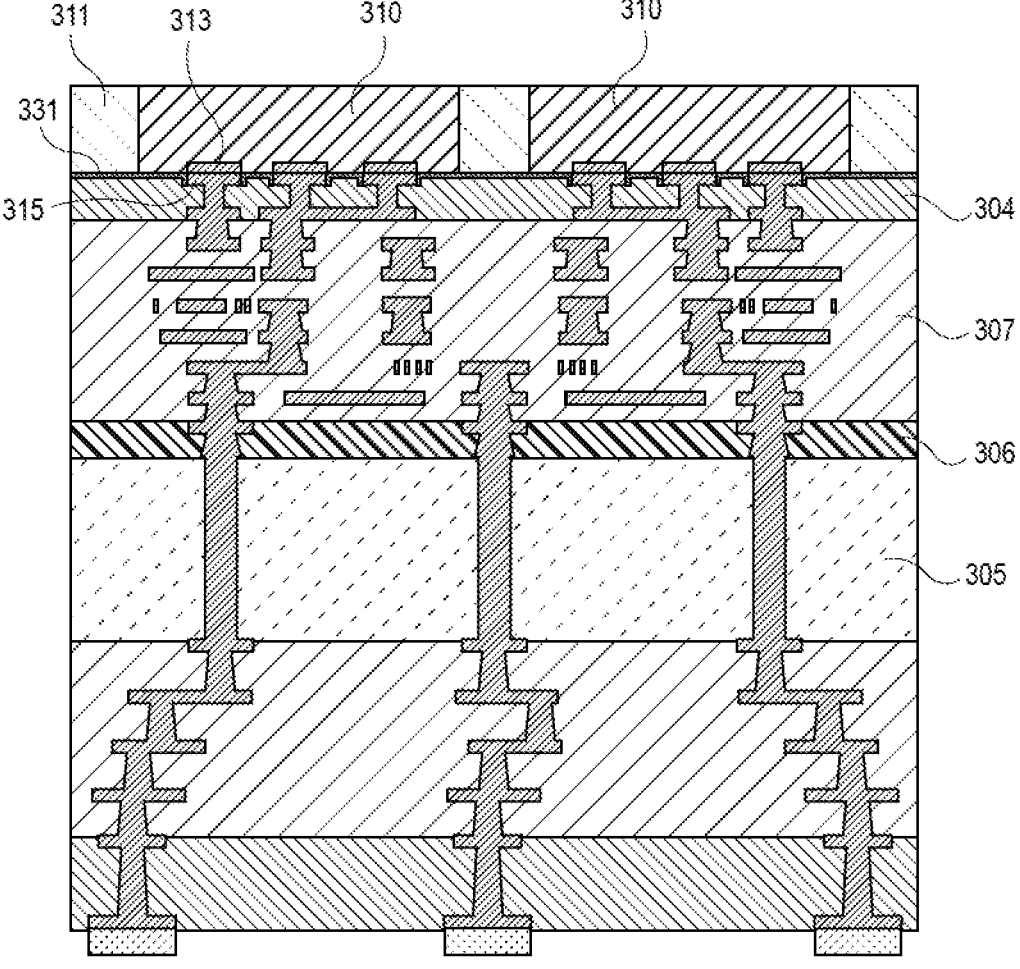

Referring now to FIG. 3K, a cross-sectional illustration of the structure after the carrier 301 is released and dies 310 are attached is shown, in accordance with an embodiment. In an embodiment, the carrier 301 is released by a laser weakening the release layer 351. After the carrier 301 is released, the seed layer 361 is etched away. The seed layer 361 may be etch selective to the FIL pads 315. After the seed layer 361 is removed, hybrid bonding may be implemented to bond the die pads 313 to the FLI pads 315. In an embodiment, the hybrid bonding includes interdiffusion bonding between the die pads 313 and the FLI pads 315. In some embodiments, an interface between the die pads 313 and the FLI pads 315 may not be discernable. Additionally, it is to be appreciated that the presence of the core 305 aids in maintaining the flatness of the package substrate even after the carrier 301 is released.

Figure 4A:
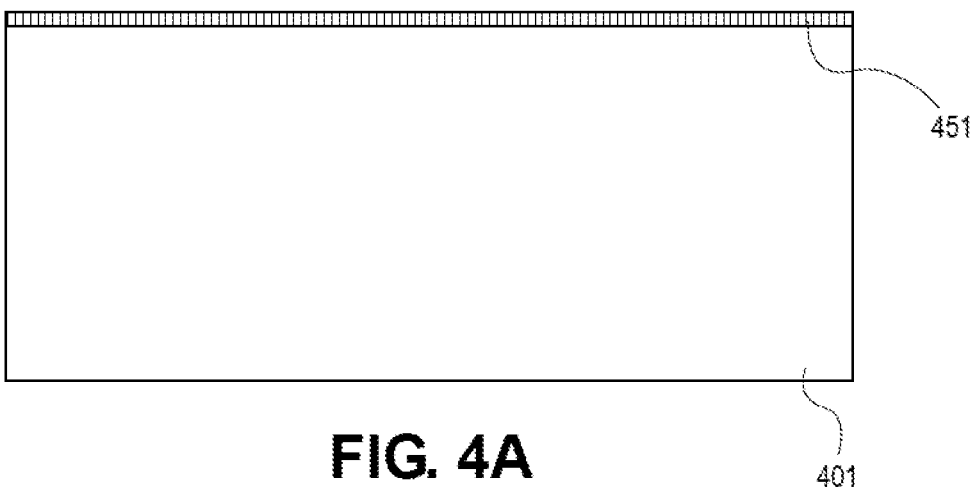
FIGS. 4A-4N are cross-sectional illustrations depicting a process for fabricating an electronic package similar to the electronic package shown in FIG. 1C, in accordance with an embodiment.
Figure 4B:
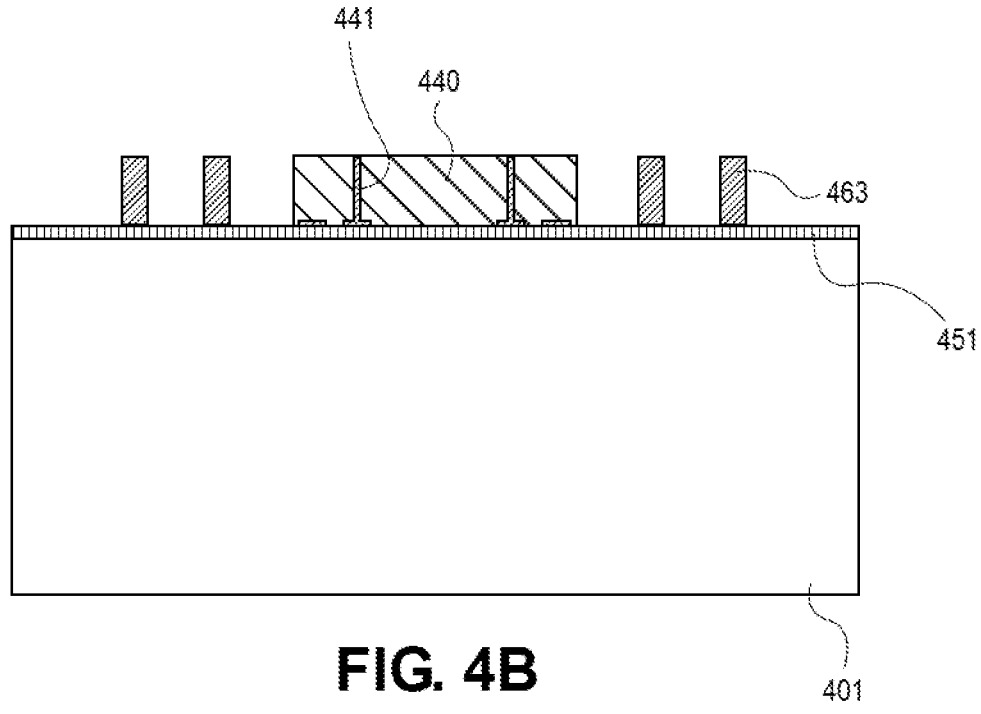
Figure 4C:
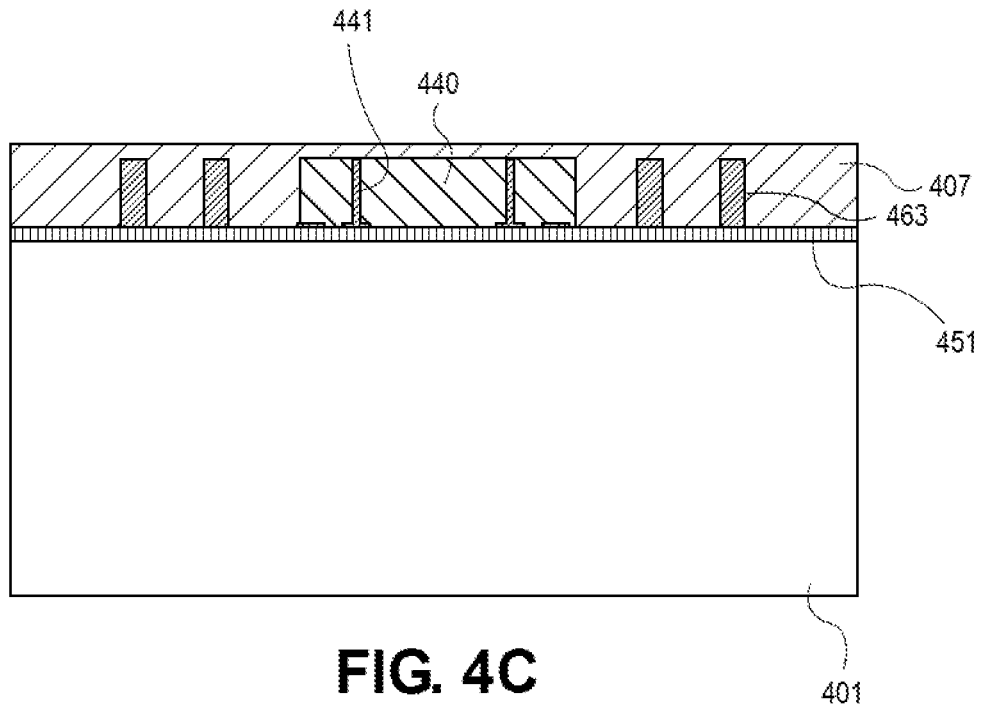
Figure 4D:
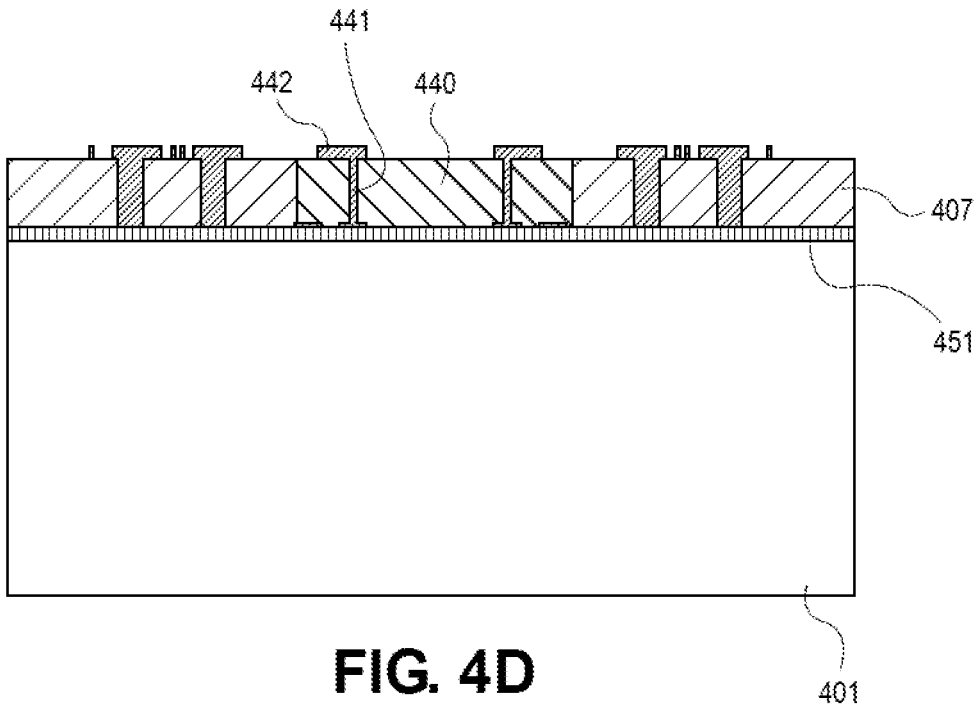
Figure 4E:
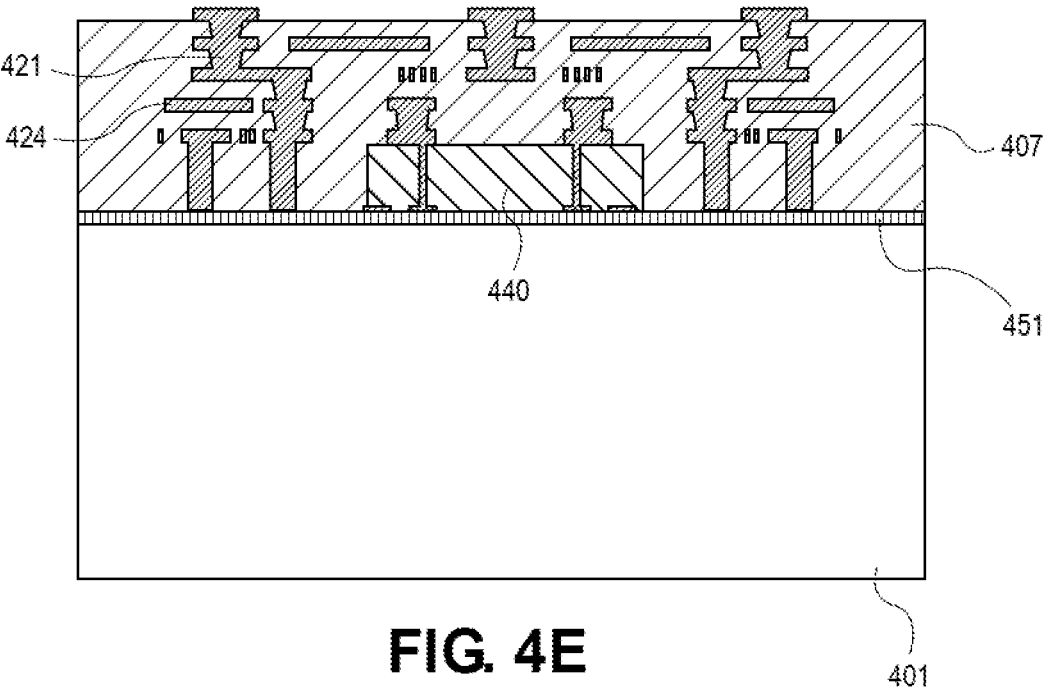
Figure 4F:
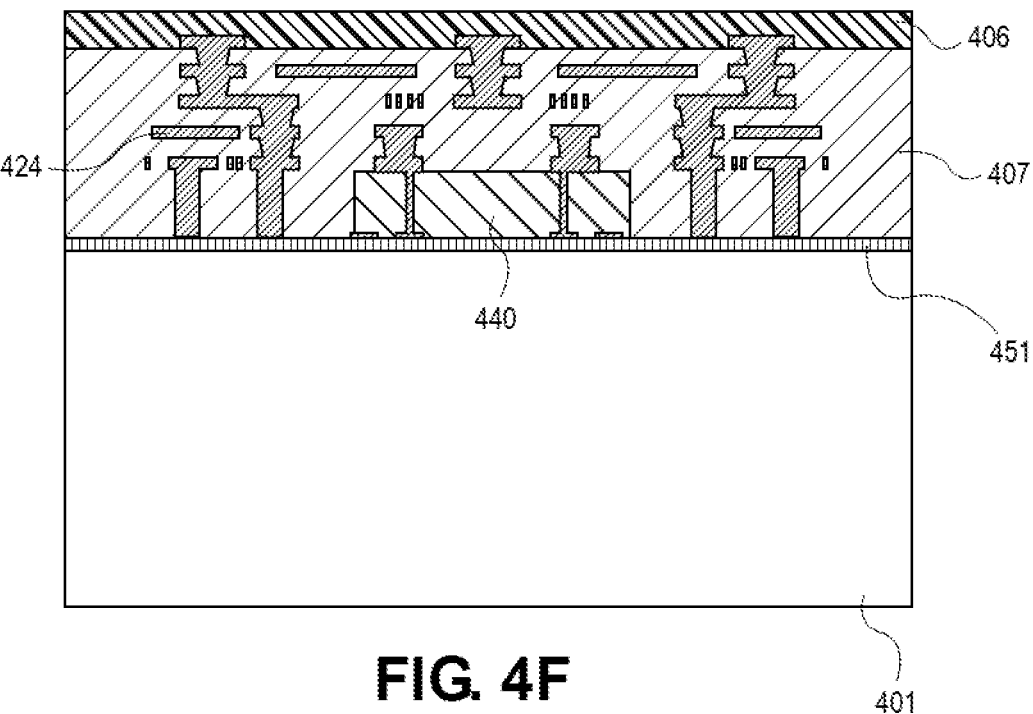
Figure 4G:
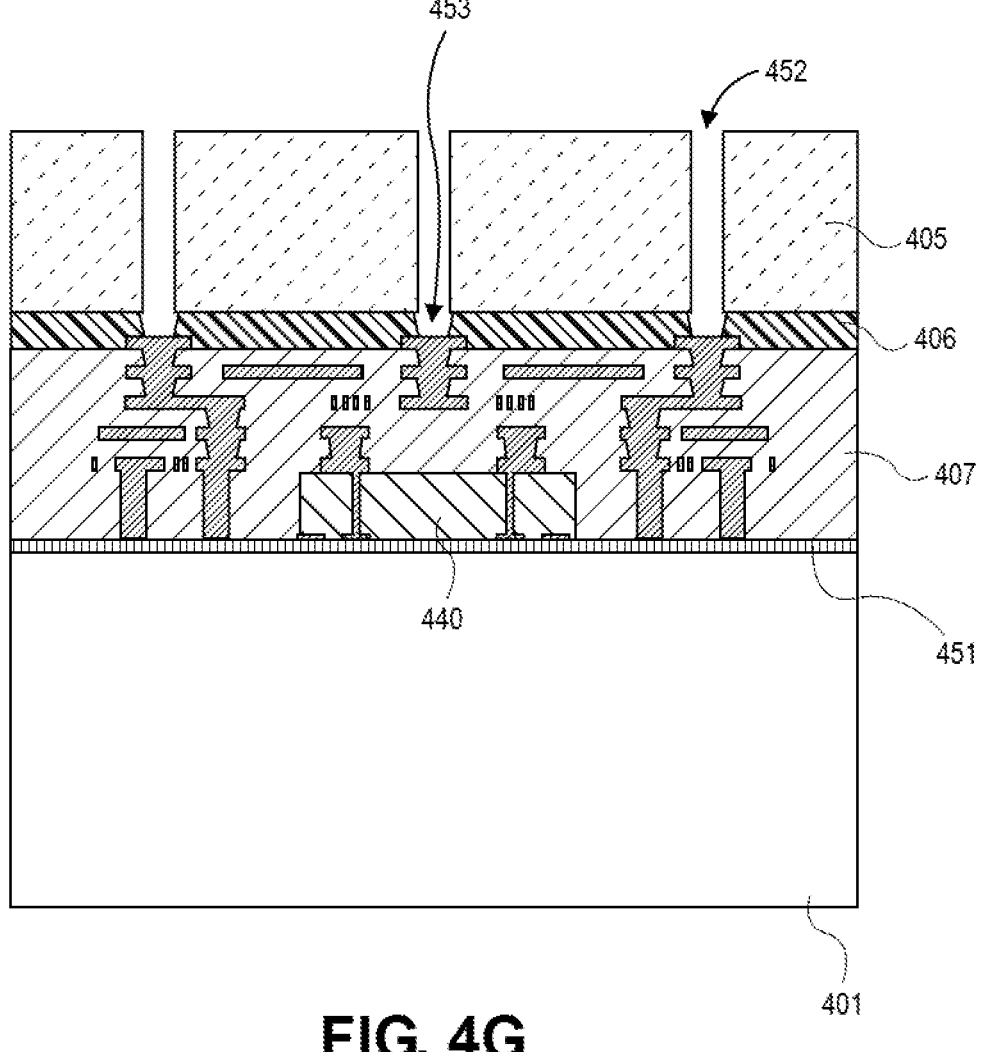
Figure 4H:
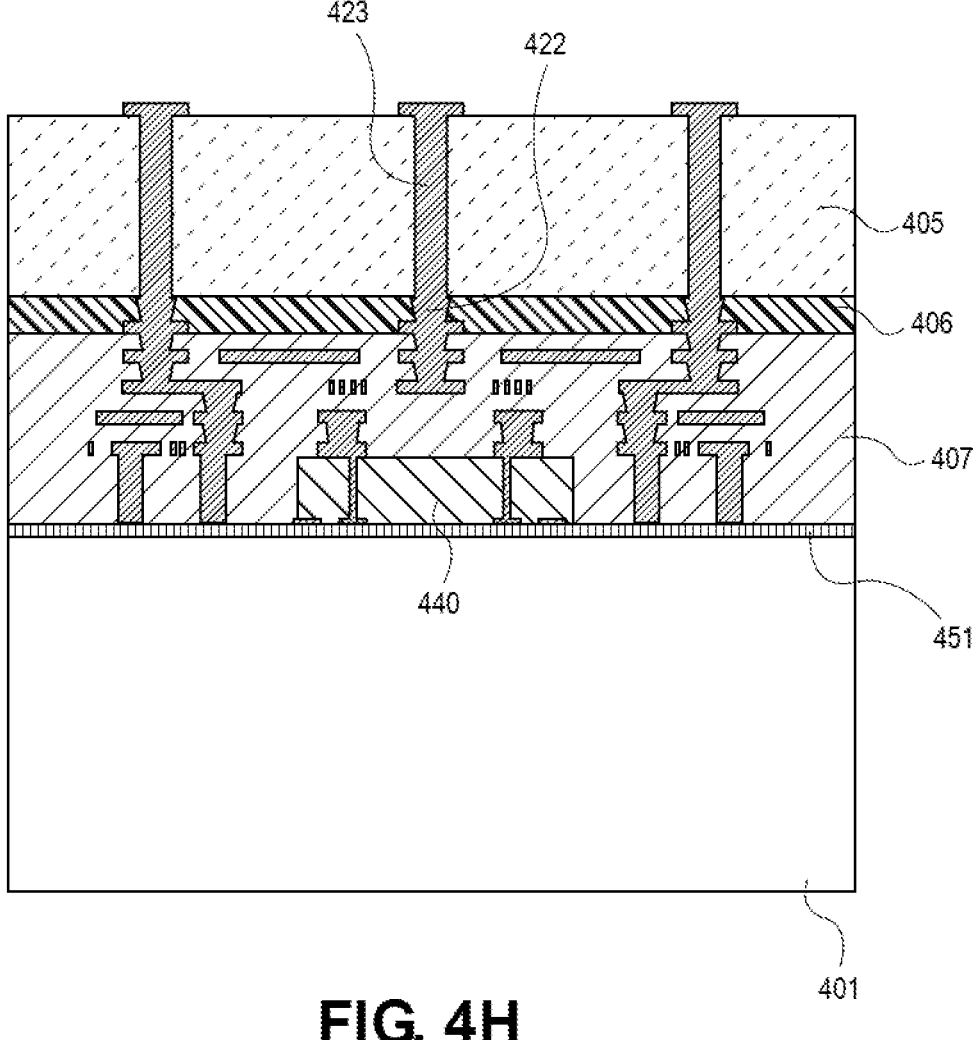
Figure 4I:
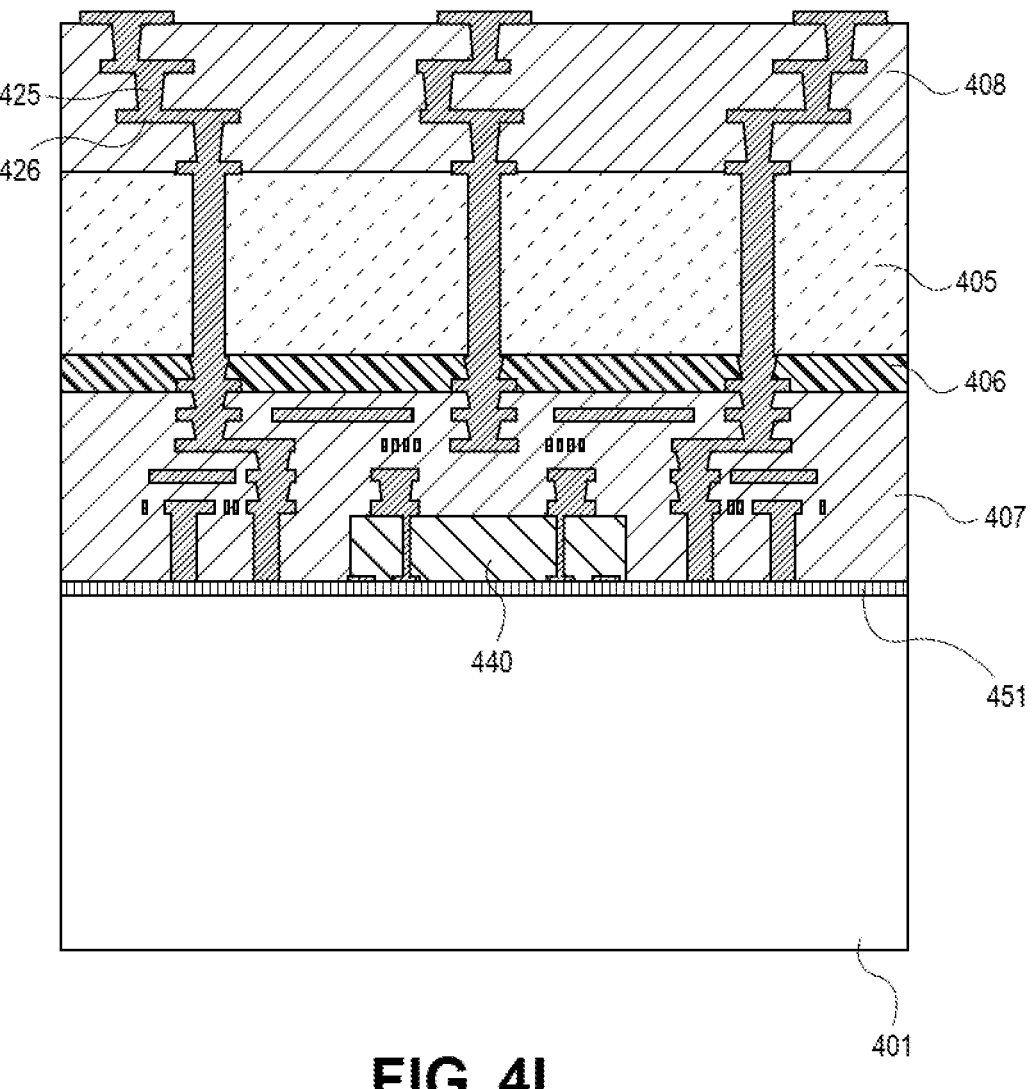
Figure 4J:
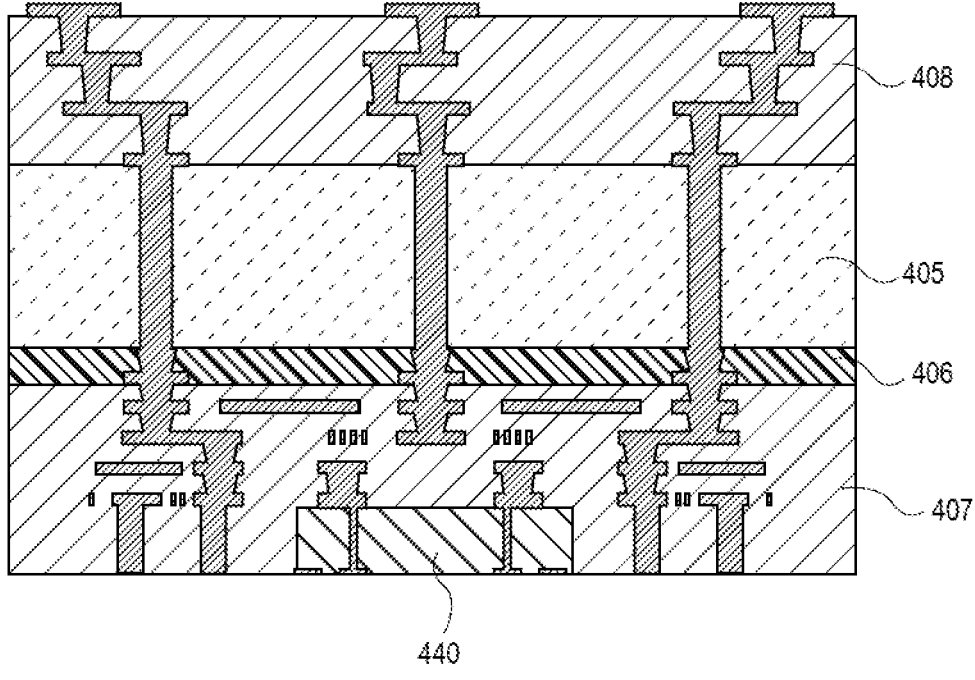
Figure 4K:
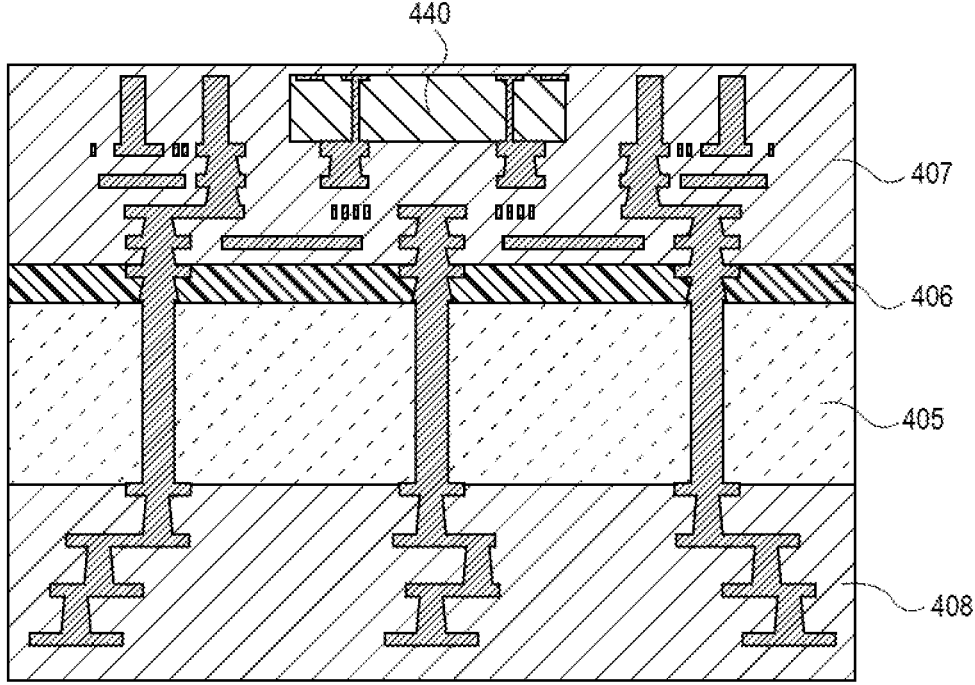
Figure 4L:
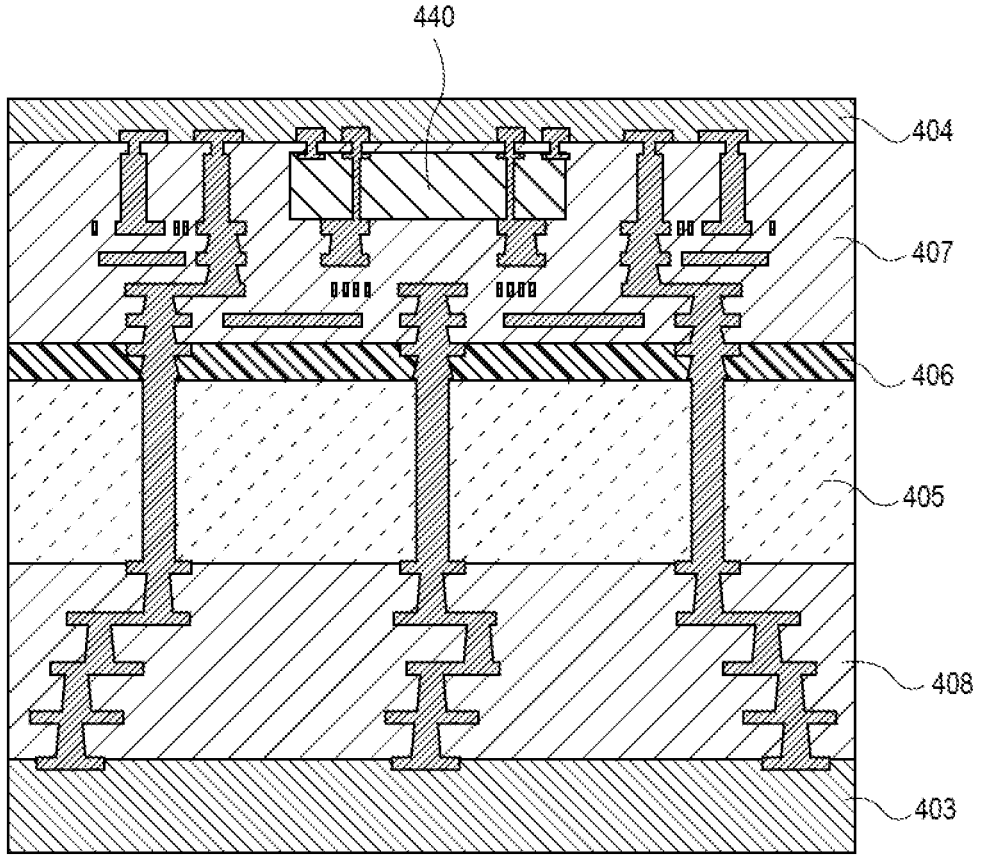
Figure 4M:
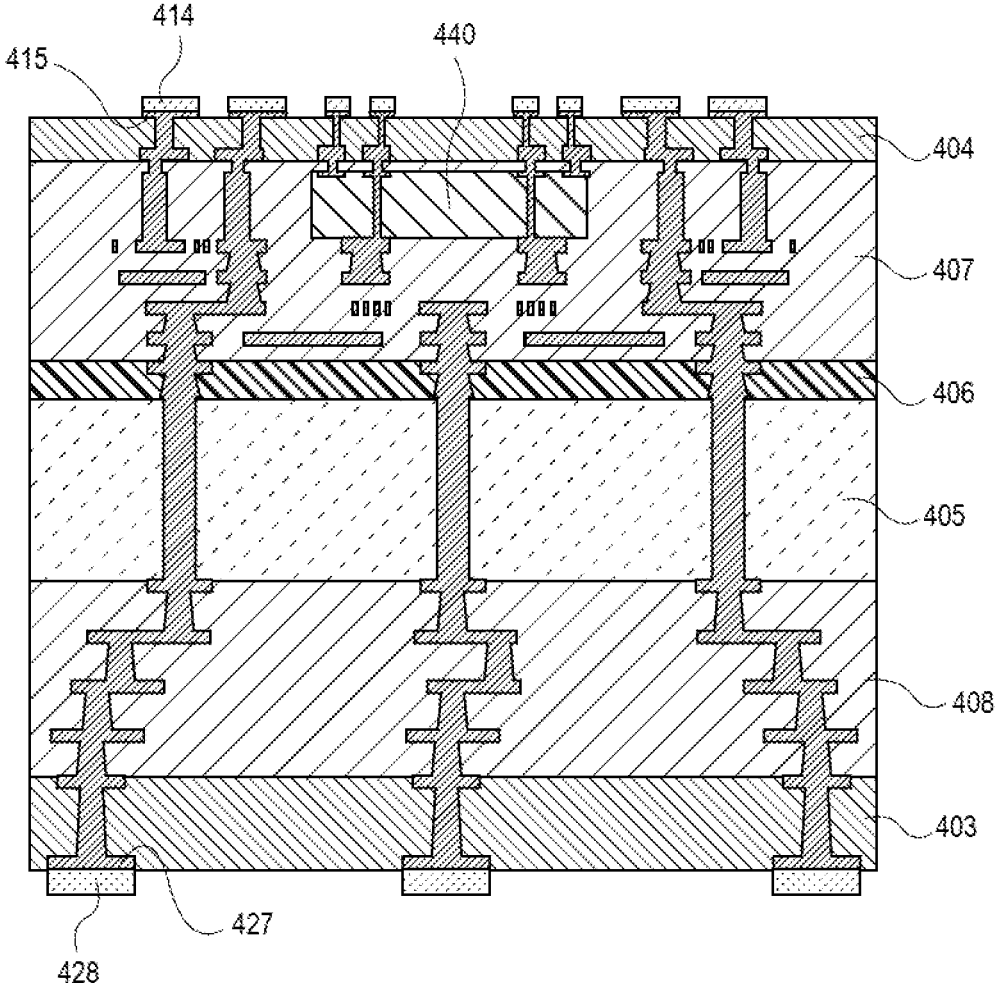
Figure 4N:
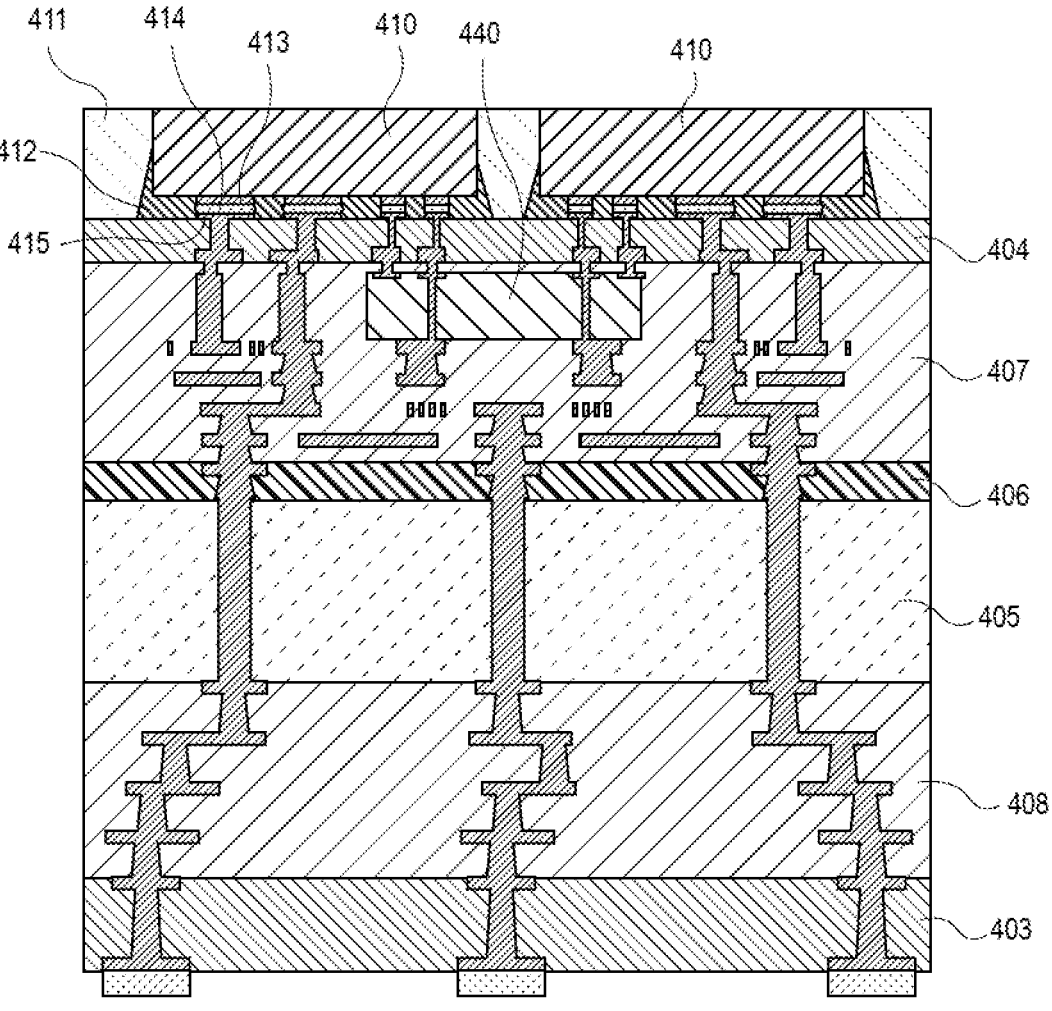

Referring now to FIGS. 4A-4N, a series of cross-sectional illustrations depicting a process for forming an electronic package is shown, in accordance with an embodiment. The electronic package fabricated in FIGS. 4A-4N may be substantially similar to the electronic package 100 shown in FIG. 1C.

Referring now to FIG. 4A, a cross-sectional illustration of a carrier 401 is shown, in accordance with an embodiment. In an embodiment, the carrier 401 may be a thick glass carrier. A release layer 451 may be provided over a top surface of the carrier 401. The release layer 451 may be a laser activated release layer. That is, when exposed to a laser, the release layer 451 detaches to release the carrier 401.

Referring now to FIG. 4B, a cross-sectional illustration of the structure after a bridge 440 and pillars 463 are disposed over the release layer 451 is shown, in accordance with an embodiment. In an embodiment, the bridge 440 is provided face down onto the release layer 451. Vias 441 may pass through the thickness of the bridge 440. In an embodiment, the bridge 440 is a silicon die or other semiconductor material. The bridge 440 may be an active bridge (i.e., including transistor devices or the like) or the bridge 440 may be a passive bridge. In an embodiment, the pillars 463 are copper pillars or the like.

Referring now to FIG. 4C, a cross-sectional illustration of the structure after a buildup layer 407 is disposed around the pillars 463 and the bridge 440 is shown, in accordance with an embodiment. The buildup layer 407 may be a dielectric material that encapsulates the bridge 440. In an embodiment, the buildup layer 407 is disposed with a lamination process.

Referring now to FIG. 4D, a cross-sectional illustration of the structure after the buildup layer 407 is recessed and metallization is provided on the bridge 440 backside is shown, in accordance with an embodiment. As shown, pads 442 are plated directly on the backside surface of the bridge 440. That is, the pads 442 directly contact the vias 441 without the need for a solder interconnection.

Referring now to FIG. 4E, a cross-sectional illustration of the structure after additional buildup layers 407 and routing is provided over the bridge 440 is shown, in accordance with an embodiment. In an embodiment, the conductive routing may include pads/traces 424 and vias 421. In an embodiment, the vias are oriented so that the bridge 440 is closer to a narrow end of the via 421 than the wide end of the via 421.

Referring now to FIG. 4F, a cross-sectional illustration of the structure after a film 406 is disposed over the buildup layers 407 is shown, in accordance with an embodiment. In an embodiment, the film 406 is a bond film. For example, the film 406 may be an adhesive dielectric or the like. The film 406 may conform to the pads 424 on a top surface of the buildup layers 407.

Referring now to FIG. 4G, a cross-sectional illustration of the structure after a core 405 is attached to the film 406 is shown, in accordance with an embodiment. In an embodiment, the core 405 may have via openings 452 patterned through a thickness of the core 405 before the core 405 is attached to the film 406. In an embodiment, the core 405 may comprise glass. For example, the core 405 may be a glass substrate with any suitable glass formulation. In an embodiment, the form factor of the core 405 may be smaller than panel sized. In a particular embodiment, the core 405 may have a unit sized form factor. That is, the core 405 may be sized to be used for a single electronic package. In an embodiment, a thickness of the core 405 may be approximately 500 μm or smaller. In a particular embodiment the core 405 may have a thickness of approximately 50 μm or smaller. The smaller form factor of the core 405 allows for easier handling despite the thinness of the core 405.

FIG. 4G also depicts openings 453 formed through the film 406. In an embodiment, the openings are formed with a dry etching process (e.g., a plasma etching process). Since the core 405 serves as the mask for the etching process, the openings 453 are self-aligned with the via openings 452. For example, centerlines of the via openings 452 may be substantially aligned with centerlines of the openings 452. In some embodiments, there may be some degree of undercutting with the etching process. As such, a top of the openings 453 may be wider than the openings 452 in some embodiments. Additionally, the openings 453 may have a tapered cross-section with the core 405 closer to a wider end than the narrow end.

Referring now to FIG. 4H, a cross-sectional illustration of the structure after conductive material is disposed in the openings 452 and 453 to form vias is shown, in accordance with an embodiment. In an embodiment, a first via 423 is formed through the core 405 and a second via 422 is formed through the film 406. The conductive material may be deposited with any suitable deposition process (e.g., seed deposition, resist pattern, copper plate, and seed etch). It is to be appreciated that the first via 423 and the second via 422 are directly in contact with each other. That is, there is no pad or other feature provided between the first via 423 and the second via 422. Additionally, the interface between the first via 423 and the second via 422 may be identified by a sharp change in the width of the conductive material. For example, at the interface, the second via 422 may be wider than the first via 423.

Referring now to FIG. 4I, a cross-sectional illustration of the structure after second buildup layers 408 are formed is shown, in accordance with an embodiment. In an embodiment, the second buildup layers 408 may comprise conductive routing (e.g., pads/traces 426 and vias 425).

Referring now to FIG. 4J, a cross-sectional illustration of the structure after the carrier 401 is released is shown, in accordance with an embodiment. In an embodiment, the carrier 401 may be released by exposing the release layer 451 to a laser. Releasing the carrier 401 results in the front side surface of the bridge 440 being exposed.

Referring now to FIG. 4K, a cross-sectional illustration of the structure after dielectric lamination on both surfaces is shown, in accordance with an embodiment. For example, the buildup layers 407 and 408 may be extended by laminating additional dielectric material over the surfaces.

Referring now to FIG. 4L, a cross-sectional illustration of the structure after solder resist layers 404 and 403 are formed over the surfaces is shown, in accordance with an embodiment. In an embodiment, the solder resist layers 404 and 403 may be formed with a lamination process. Pads may be formed over the outermost buildup layers 407 and 408, and the solder resist layers 404 and 403 may be provided over those pads. In an embodiment, the pads may be coupled to the bridge 440 by vias through the buildup layer 407.

Referring now to FIG. 4M, a cross-sectional illustration of the structure after FLIs and SLIs are formed is shown, in accordance with an embodiment. In an embodiment, the FLIs may include FLI pads 415 and solder 414. The SLIs comprise pads 427, and a solder 428 may be provided over the SLI pads 427.

Referring now to FIG. 4N, a cross-sectional illustration of the structure after dies 410 are attached to the package substrate is shown, in accordance with an embodiment. In an embodiment, the pads 413 on the dies 410 may be coupled to the FLI pads 415 by the solder 413. An underfill 412 may surround the FLIs and a mold layer 411 may surround the dies 410. In an embodiment, the dies 410 may be electrically coupled together by the bridge 440.

Figure 5:
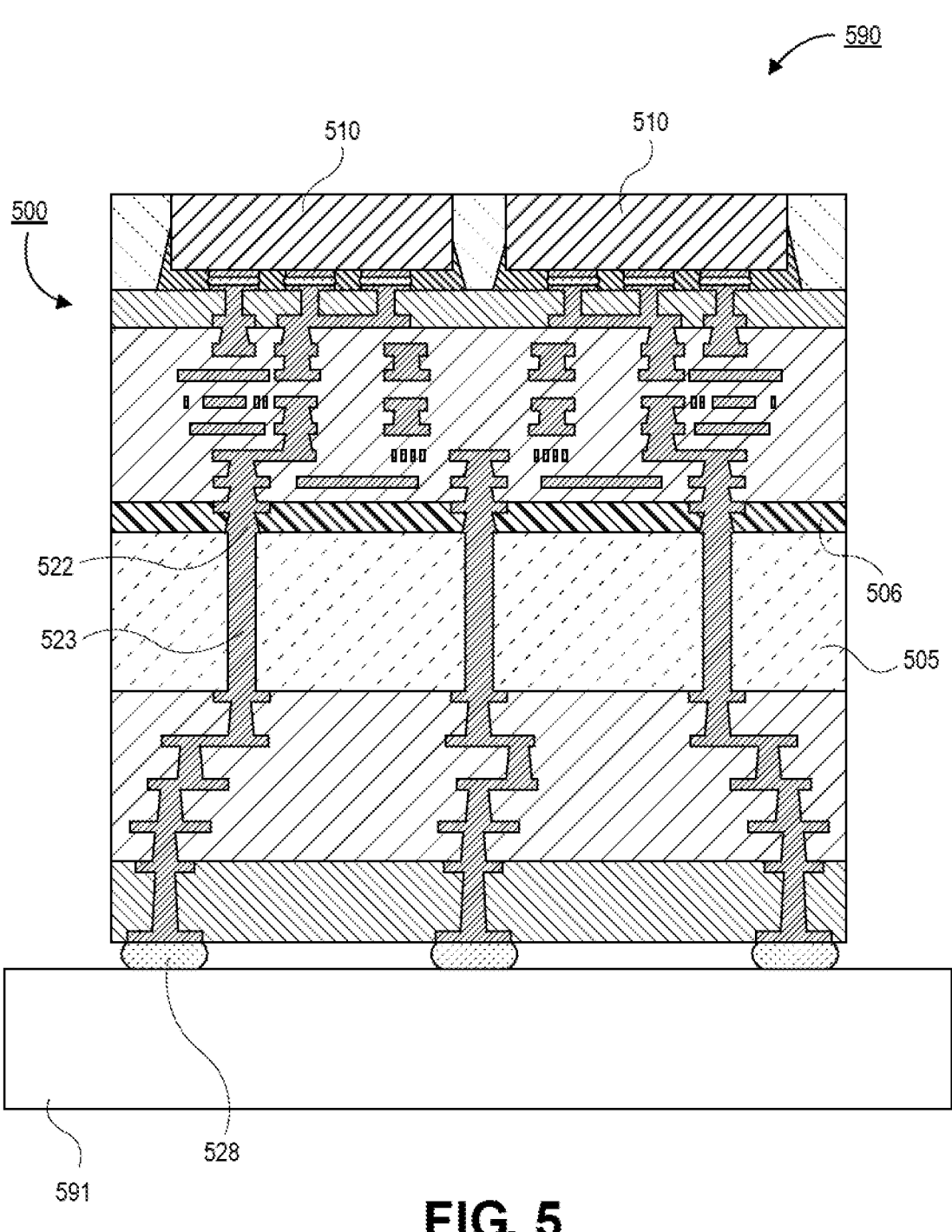
FIG. 5 is a cross-sectional illustration of an electronic system with an electronic package with a glass core coupled to a board, in accordance with an embodiment.

Referring now to FIG. 5, a cross-sectional illustration of an electronic system 590 is shown, in accordance with an embodiment. In an embodiment, the electronic system 590 comprises a board 591. The board 591 may be coupled to an electronic package 500 by solder 528 of a SLI on the electronic package. In an embodiment, the electronic package 500 may be substantially similar to any of the electronic packages described herein. For example, the electronic package 500 in FIG. 5 is substantially similar to the electronic package 100 in FIG. 1A. That is, the electronic package 500 comprises package substrate with a core 505 and a film 506. A via 523 is through the core 505 and a via 522 is through the film 506. The via 523 and the via 522 are in direct contact with each other. Dies 510 may be coupled to the package substrate by FLIs.

Figure 6:
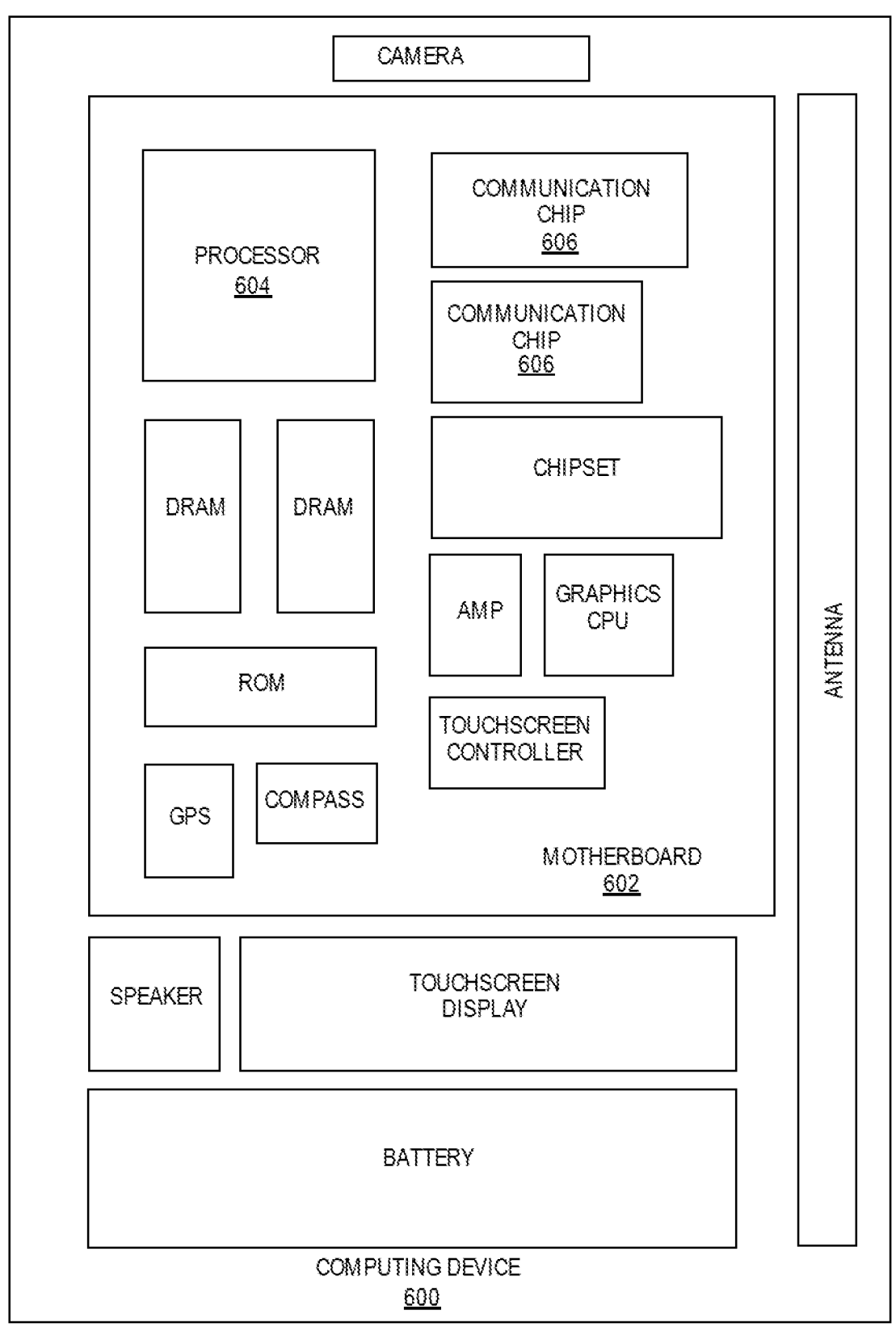
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be part of an electronic package that comprises a core with a bond film and vias passing through the core and the bond film, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be part of an electronic package that comprises a core with a bond film and vias passing through the core and the bond film, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a core with a first surface and a second surface, wherein the core comprises glass; a first via through the core, wherein the first via comprise a conductive material; a film over the first surface of the core, wherein the film is an adhesive; a second via through the film, wherein the second via comprises a conductive material, wherein the second via contacts the first via, and wherein a centerline of the second via is aligned with a centerline of the first via; and a buildup layer over the film.

Example 2: the package substrate of Example 1, wherein a width of the second via is greater than a width of the first via at an interface between the first via and the second via.

Example 3: the package substrate of Example 1 or Example 2, wherein the second via has a tapered profile.

Example 4: the package substrate of Example 3, wherein a first end of the second via has a first width and a second end of the second via has a second width that is smaller than the first width, and wherein the first end is closer to the core than the second end.

Example 5: the package substrate of Examples 1-5, further comprising: a first level interconnect over the buildup layer.

Example 6: the package substrate of Example 5, further comprising: a plurality of buildup layers; and conductive routing through the buildup layers to electrically couple the first level interconnect to the first via.

Example 7: the package substrate of Example 6, wherein a third via in the buildup layers has a tapered profile with a narrow end and a wide end, and wherein a first distance between the narrow end and the first level interconnect is smaller than a second distance between the wide end and the first level interconnect.

Example 8: the package substrate of Examples 5-7, wherein the first level interconnect is lined by an interface layer, wherein the interface layer is a dielectric.

Example 9: the package substrate of Example 8, wherein the first level interconnect and the interface layer are configured for hybrid bonding.

Example 10: the package substrate of Examples 5-9, further comprising a solder over the first level interconnect.

Example 11: the package substrate of Examples 1-10, further comprising: a bridge embedded in the buildup layer, wherein a third surface of the bridge faces away from the core, and wherein a fourth surface of the bridge faces the core.

Example 12: the package substrate of Example 11, wherein a third via passes through the bridge from the third surface to the fourth surface.

Example 13: the package substrate of Example 12, wherein a pad is disposed over the third via on the fourth surface of the bridge.

Example 14: the package substrate of Examples 1-13, wherein a thickness of the core is approximately 2 mm or less.

Example 15: an electronic package, comprising: a package substrate, wherein the package substrate comprises: a core, wherein the core comprises glass, and wherein a first via passes through the core; a film over the core, wherein the film is an adhesive, and wherein a second via passes through the film, wherein the first via is aligned with the second via; and buildup layers over the film, wherein a first level interconnect is provided over the buildup layers; and a die coupled to the package substrate by the first level interconnect.

Example 16: the electronic package of Example 15, wherein the first level interconnect comprises a hybrid bond with the die.

Example 17: the electronic package of Example 15, wherein the first level interconnect comprises a solder.

Example 18: the electronic package of Examples 15-17, wherein the second via is tapered with a wide end and a narrow end, and wherein a first distance between the wide end and the core is smaller than a second distance between the narrow end and the core.

Example 19: the electronic package of Example 18, wherein the wide end of the second via is wider than a width of the first via.

Example 20: the electronic package of Example 19, wherein a centerline of the first via is aligned with a centerline of the second via.

Example 21: the electronic package of Examples 15-20, further comprising: a bridge embedded in the buildup layers, wherein the bridge electrically couples the die to a second die.

Example 22: the electronic package of Examples 15-21, wherein a third via in the buildup layers has a tapered profile with a narrow end and a wide end, and wherein a first distance between the narrow end and the first level interconnect is smaller than a second distance between the wide end and the first level interconnect.

Example 23: an electronic system, comprising: a board; a package substrate coupled to the board, wherein the package substrate comprises: a core, wherein the core comprises glass; a film over the core, wherein the film is an adhesive; and buildup layers over the film, wherein a first via passes through the core and a second via passes through the film, wherein the first via is aligned with the second via; and a die coupled to the package substrate.

Example 24: the electronic system of Example 23, wherein the die is coupled to the buildup layers by a hybrid bond.

Example 25: the electronic system of Example 23, wherein the die is coupled to the buildup layers by a solder interconnect.

What is claimed is:

1. A package substrate, comprising:
a core with a first surface and a second surface, wherein the core comprises glass;
a first via through the core, wherein the first via comprises a conductive material;
a film over the first surface of the core, wherein the film is an adhesive;
a second via in the film, wherein the second via comprises a conductive material, wherein the second via contacts the first via, wherein the second via tapers outwardly along a direction toward the first via, and wherein the second via has a greater width greater than a width of the first via where the second via contacts the first via; and
a conductive pad in the film, the conductive pad over and coupled to the second via, the conductive pad having a width greater than the width of the first via and greater than the width of the second via, and the conductive pad having a top surface at a same level as a top surface of the film; and
a buildup layer over the film.

2. The package substrate of claim 1, wherein a first end of the second via has a first width and a second end of the second via has a second width that is smaller than the first width, and wherein the first end is closer to the core than the second end.

3. The package substrate of claim 1, further comprising: a first level interconnect over the buildup layer.

4. The package substrate of claim 3, further comprising: a plurality of buildup layers; and
conductive routing through the buildup layers to electrically couple the first level interconnect to the first via.

5. The package substrate of claim 4, wherein a third via in the buildup layers has a tapered profile with a narrow end and a wide end, and wherein a first distance between the narrow end and the first level interconnect is smaller than a second distance between the wide end and the first level interconnect.

6. The package substrate of claim 3, wherein the first level interconnect is lined by an interface layer, wherein the interface layer is a dielectric.

7. The package substrate of claim 6, wherein the first level interconnect and the interface layer are configured for hybrid bonding.

8. The package substrate of claim 3, further comprising a solder over the first level interconnect.

9. The package substrate of claim 1, further comprising:
a bridge embedded in the buildup layer, wherein a third surface of the bridge faces away from the core, and wherein a fourth surface of the bridge faces the core.

10. The package substrate of claim 9, wherein a third via passes through the bridge from the third surface to the fourth surface.

11. The package substrate of claim 10, wherein a pad is disposed over the third via on the fourth surface of the bridge.

12. The package substrate of claim 1, wherein a thickness of the core is approximately 2 mm or less.

13. An electronic package, comprising:
a package substrate, wherein the package substrate comprises:
a core, wherein the core comprises glass, and wherein a first via passes through the core;
a film over the core, wherein the film is an adhesive, wherein a second via is in the film, wherein the first via is in contact with the second via, wherein the second via tapers outwardly along a direction toward the first via, wherein the second via has a width greater than a width of the first via where the second via contacts the first via, and a conductive pad in the film, the conductive pad over and coupled to the second via, the conductive pad having a width greater than the width of the first via and greater than the width of the second via, and the conductive pad having a top surface at a same level as a top surface of the film; and
buildup layers over the film, wherein a first level interconnect is provided over the buildup layers; and
a die coupled to the package substrate by the first level interconnect.

14. The electronic package of claim 13, wherein the first level interconnect comprises a hybrid bond with the die.

15. The electronic package of claim 13, wherein the first level interconnect comprises a solder.

16. The electronic package of claim 13, wherein the second via is tapered with a wide end and a narrow end, and wherein a first distance between the wide end and the core is smaller than a second distance between the narrow end and the core.

17. The electronic package of claim 16, wherein the wide end of the second via is wider than a width of the first via.

18. The electronic package of claim 17, wherein a centerline of the first via is aligned with a centerline of the second via.

19. The electronic package of claim 13, further comprising:
a bridge embedded in the buildup layers, wherein the bridge electrically couples the die to a second die.

20. The electronic package of claim 13, wherein a third via in the buildup layers has a tapered profile with a narrow end and a wide end, and wherein a first distance between the narrow end and the first level interconnect is smaller than a second distance between the wide end and the first level interconnect.

21. An electronic system, comprising:
a board;
a package substrate coupled to the board, wherein the package substrate comprises:
a core, wherein the core comprises glass;
a film over the core, wherein the film is an adhesive; and buildup layers over the film, wherein a first via passes through the core and a second via is in the film, wherein the first via is in contact with the second via, wherein the second via tapers outwardly along a direction toward the first via, wherein the second via has a width greater than a width of the first via where the second via contacts the first via, and a conductive pad is in the film, the conductive pad over and coupled to the second via, the conductive pad having a width greater than the width of the first via and greater than the width of the second via, and the conductive pad having a top surface at a same level as a top surface of the film; and a die coupled to the package substrate.

22. The electronic system of claim 21, wherein the die is coupled to the buildup layers by a hybrid bond.

23. The electronic system of claim 21, wherein the die is coupled to the buildup layers by a solder interconnect.

\* \* \* \* \*